United States Patent
Bogner

(10) Patent No.: US 9,684,021 B2
(45) Date of Patent: Jun. 20, 2017

(54) RESISTANCE MEASUREMENT

(71) Applicant: Infineon Technologies AG, Neubiberg (DE)

(72) Inventor: Peter Bogner, Wernberg (AT)

(73) Assignee: Infineon Technologies AG, Neubiberg (DE)

(*) Notice: Subject to any disclaimer, the term of this patent is extended or adjusted under 35 U.S.C. 154(b) by 565 days.

(21) Appl. No.: 13/942,098

(22) Filed: Jul. 15, 2013

(65) Prior Publication Data
US 2015/0015281 A1    Jan. 15, 2015

(51) Int. Cl.
| | | |
|---|---|---|
| *G01R 27/02* | (2006.01) | |
| *G01R 27/20* | (2006.01) | |
| G01R 31/04 | (2006.01) | |
| G01R 31/00 | (2006.01) | |
| G01R 31/28 | (2006.01) | |

(52) U.S. Cl.
CPC ........... *G01R 27/02* (2013.01); *G01R 27/20* (2013.01); *G01R 31/007* (2013.01); *G01R 31/046* (2013.01); *G01R 31/2829* (2013.01)

(58) Field of Classification Search
CPC .... G01R 27/02; G01R 27/20; G01R 19/0092; G01R 17/105; G01R 31/007; G01R 31/2829; G01R 31/046; B60R 21/0173
USPC ................................................. 324/691, 705
See application file for complete search history.

(56) References Cited

U.S. PATENT DOCUMENTS

| | | | | |
|---|---|---|---|---|
| 5,506,509 A | * | 4/1996 | Susak | ................. B60R 21/0173 324/550 |
| 6,359,450 B1 | * | 3/2002 | Zabler | .................. B60R 16/027 324/502 |
| 2003/0218462 A1 | * | 11/2003 | Dick | ................... B60R 21/0173 324/502 |

(Continued)

FOREIGN PATENT DOCUMENTS

| | | |
|---|---|---|
| EP | 0716309 A2 | 6/1996 |
| EP | 1473572 A1 | 11/2004 |

(Continued)

OTHER PUBLICATIONS

Office Action, in the Chinese language, from counterpart Chinese Application No. 201410337161.X, dated Sep. 5, 2016, 10 pp.

*Primary Examiner* — Son Le
*Assistant Examiner* — Brent J Andrews
(74) *Attorney, Agent, or Firm* — Shumaker & Sieffert, P.A.

(57) ABSTRACT

This disclosure describes techniques for measuring the resistance of a component with measurement circuitry that is electrically coupled to the component via one or more electrical conductors (e.g., one or more bond wires). The resistance measurement techniques of this disclosure may measure a resistance of an electrical conductor, and generate a value indicative of a resistance of a component other than the electrical conductor based on the measured resistance of the electrical conductor. The electrical conductor for which the resistance is measured may be the same as or different than one or more of the electrical conductors that couple the measurement circuitry to the component to be measured. Using an electrical conductor resistance measurement to determine the resistance of a component may improve the accuracy of the resistance measurement for the component.

20 Claims, 12 Drawing Sheets

(56) References Cited

U.S. PATENT DOCUMENTS

2011/0001501 A1* 1/2011 Walker ................. G01R 17/105
                                                            324/706
2012/0098593 A1* 4/2012 Downey ................ H01C 17/22
                                                            327/567

FOREIGN PATENT DOCUMENTS

| JP | 2002228695 A | 8/2002 |
| JP | 2004333493 A | 11/2004 |

* cited by examiner

RESISTANCE MEASUREMENT

TECHNICAL FIELD

This disclosure relates to resistance measurement techniques.

BACKGROUND

A variety of applications may utilize a resistance measurement circuit to measure the resistance of one or more components in a device. The resistance measurements obtained by such a circuit may be used, for example, to detect a fault condition in the device, detect device degradation and/or to control the operation of the device. In some applications, the target resistance to be measured may be a relatively low resistance relative to the resistance of the electrical connections that couple the resistance measurement circuit to the target resistance to be measured. In such examples, the resistance of the electrical connections may make it difficult to obtain accurate measurements of the target resistance.

SUMMARY

This disclosure describes techniques for measuring the resistance of a component with measurement circuitry that is electrically coupled to the component via one or more electrical conductors (e.g., one or more bond wires). The resistance measurement techniques of this disclosure may measure the resistance of one or more electrical conductors, and use the resistance measurements of the electrical conductors to generate a value indicative of the resistance of the component. The electrical conductors used to obtain the electrical conductor resistance measurements may be the same as or different than one or more of the electrical conductors that couple the measurement circuitry to the component. Using resistance measurements for one or more electrical conductors to determine the resistance of a component may improve the accuracy of the resistance measurement for the component.

In one example, this disclosure describes a method that includes measuring, with circuitry, a resistance of an electrical conductor. The method further includes generating, with the circuitry, a value indicative of a resistance of a component other than the electrical conductor based on the measured resistance of the electrical conductor.

In another example, this disclosure describes a device that includes circuitry configured to measure a resistance of an electrical conductor and generate a value indicative of a resistance of a component other than the electrical conductor based on the measured resistance of the electrical conductor.

In another example, this disclosure describes an apparatus that includes means for measuring a resistance of an electrical conductor; and means for generating a value indicative of a resistance of a component other than the electrical conductor based on the measured resistance of the electrical conductor.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
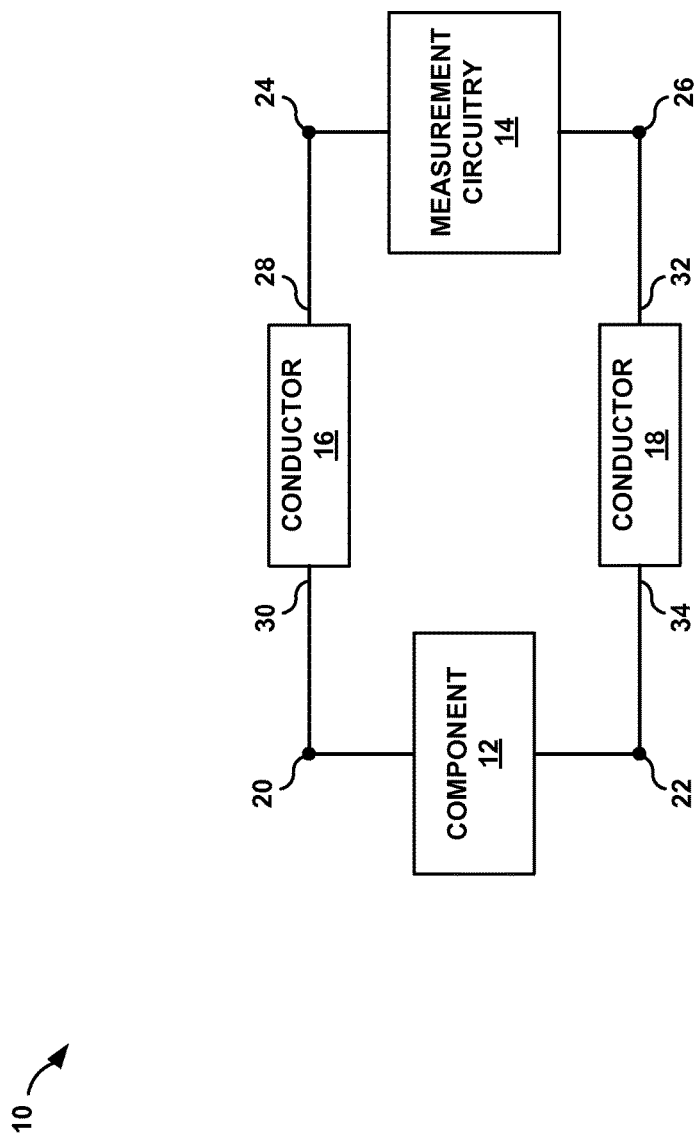
FIG. 1 is a block diagram illustrating an example system that may be used to perform the resistance measurement techniques of this disclosure.

This disclosure describes techniques for measuring the resistance of a component with measurement circuitry that is electrically coupled to the component via one or more electrical conductors (e.g., one or more bond wires). The resistance measurement techniques of this disclosure may measure the resistance of one or more electrical conductors, and use the resistance measurements of the electrical conductors to generate a value indicative of the resistance of the component. The electrical conductors used to obtain the electrical conductor resistance measurements may be the same as or different than one or more of the electrical conductors that couple the measurement circuitry to the component. Using resistance measurements for one or more electrical conductors to determine the resistance of a component may improve the accuracy of the resistance measurement for the component.

Some techniques for measuring a resistance of a component may involve using electrical conductors to measure a voltage that is generated in response to a current that is applied to the component via the electrical conductors or using electrical conductors to measure a current that is generated in response to a voltage that is applied to the component via the electrical conductors. In cases where the resistance of the component to be measured is relatively low compared to the resistance of the electrical conductors through which the applied or measured current flows, the resistance of the electrical conductors may reduce the accuracy of the component resistance measurement. The techniques of this disclosure may, in some examples, correct the component resistance measurement based on one or more electrical conductor resistance measurements. In this way, inaccuracies that may be introduced into the component resistance measurement due to the resistance of the electrical conductors may be reduced and/or eliminated.

In some examples, to measure the resistance of the component, a current path may be formed using a first electrical conductor, the component to be measured, and a second electrical conductor such that the first electrical conductor is electrically coupled between the measurement circuitry and a first terminal of the component and the second electrical conductor is electrically coupled between the measurement circuitry and a second terminal of the component. The measurement circuitry may measure the resistance of the current path, and determine a value indicative of the resistance of the component based on the resistance of the current path and the measured resistance of one or more electrical conductors. For example, the measurement circuitry may subtract a multiple of the measured electrical conductor resistance from the measured resistance of the current path to generate the component resistance value.

In some examples, the electrical conductor resistance used to determine the component resistance value may be a resistance for one of the first and second electrical conductors included in the current path. The electrical conductor in the current path for which the resistance is measured may be referred to as the target electrical conductor. In such examples, an additional, third electrical conductor may be used to facilitate the measurement of the electrical conductor resistance for the target electrical conductor. The third electrical conductor may be electrically coupled between the measurement circuitry and the component such that a terminal of the component to which the third electrical conductor is electrically coupled is the same as the terminal of the component to which the target electrical conductor is electrically coupled. In such examples, the measurement circuitry may drive a current through the current path, and measure a voltage difference between the end of the third electrical conductor that is electrically coupled to the measurement circuitry and an end of the target electrical conductor that is electrically coupled to the measurement circuitry. The voltage difference may be indicative of the resistance of the target electrical conductor.

In further examples, the electrical conductor resistance used to determine the component resistance value may be a resistance for an electrical conductor that is different than the electrical conductors included in the current path that includes the first and second electrical conductors. In such examples, the electrical conductor may, in some examples, not necessarily be electrically coupled to the component to be measured. Instead, in some examples, one or both ends of the electrical conductor may be electrically coupled to the measurement circuitry. In such examples, the measurement circuitry may measure the resistance of the electrical conductor using one or both ends of the electrical conductor. For example, the measurement circuitry may drive a current through the electrical conductor and measure a voltage difference that is induced across the electrical conductor in response to the current. As another example, the measurement circuitry may apply a voltage across the electrical conductor and measure a current that flows through the electrical conductor in response to the applied voltage.

In some cases, the length of the electrical conductor corresponding to the electrical conductor resistance measurement may be different than the length of one or more of the electrical conductors that are included in the current path that is used for the component resistance measurement. In such cases, the measurement circuitry may, in some examples, be configured to calculate different correction values for the current path resistance based on the relative lengths of the electrical conductors. This may allow a single electrical conductor resistance measurement to be used to approximate the resistance of a plurality of different electrical conductors in one or more current paths that may have different lengths. Moreover, in cases where the electrical conductor resistance used to determine the component resistance value is a resistance for an electrical conductor that is different than the electrical conductors included in the current path, generating correction values based on the relative lengths of electrical conductors may allow a shorter electrical conductor to be used for obtaining an electrical conductor resistance measurement.

In some examples, the measurement circuitry may time-multiplex the electrical conductor measurements and the component resistance measurements. For example, the measurement circuitry may switch between an electrical conductor resistance measurement phase where electrical conductor resistance measurements are performed and a component resistance measurement phase where component resistance measurements are performed. Time-multiplexing the resistance measurements may, in some examples, allow the electrical conductor resistance measurements and the component resistance measurements to share all or part of a common signal path. For example, the electrical conductor resistance measurements and the component resistance measurements may share a common analog-to-digital converter that is time-multiplexed.

In further examples, the measurement circuitry may perform all or part of an electrical conductor measurement while performing all or part of the component resistance measurement. In additional examples, the measurement circuitry may periodically measure the electrical conductor resistance between and/or during the component resistance measurements.

In some examples, the component to be measured and the measurement circuitry may be disposed on a substrate, for example, one or more printed circuit boards (PCBs). In such examples, the measurement circuitry may, in some examples, be implemented on one or more integrated circuits, and the component to be measured may, in some examples, be implemented as a component that is separate from the integrated circuits upon which the measurement circuitry is implemented. In such examples, the electrical conductors between the component to be measured and the measurement circuitry may be implemented, in some examples, as one or more bond wires that are coupled between respective pads (e.g., contact pads) on the substrate (e.g., PCB). In some cases, the length of the bond wire connections may cause the resistance of such bond wires to be relatively high compared to the resistances of electrical conductors that may be used in circuits that are implemented as a single integrated circuit. In such examples, the techniques of this disclosure may correct the resulting component resistance measurement such that any error due to the relatively high bond wire resistances is reduced and/or eliminated.

In some examples, the component for which resistance is to be measured may be an air bag squib that is used in an air bag safety system, e.g., an automobile air bag safety system. An air bag squib may be used to ignite an explosion for inflating an air bag in an air bag safety system. For example, an air bag squib may be a relatively low resistance wire, which, when current flows through the wire, heats up and causes explosive material proximate to the wire to ignite. If an air bag control system senses an impact, the air bag control system may drive a current through the air bag squib to cause the air bag to inflate.

Monitoring the squib resistance may be used, for example, to detect fault conditions in the air bag squib. Example fault conditions may include conditions indicative of a squib malfunction and/or conditions indicative of squib damage. Example conditions indicative of squib malfunction and/or squib damage may include a short of a two wire interface connected to the squib, an open circuit condition for the two wire interface connected to the squib, a short to a battery, a short a ground terminal, a leakage to a battery, and a leakage to a ground terminal. A short of a two wire interface connected to the squib may, in some examples, be caused by damage due to an accident or damage that occurred during service of the vehicle. An open circuit condition for the two wire interface connected to the squib may, in some examples, be caused by corrosion of a plug for the squib and/or by damage that occurred during the service of the vehicle. In some cases, monitoring the squib resistance may be used to determine whether the air bag squib needs to be replaced. For example, an air bag squib may need to be replaced if the resistance of the air bag squib is outside of an acceptable range of resistances.

One solution to reduce and/or eliminate the contribution of the resistance of the connections that are used to measure the resistance of a component is to use Kelvin connections. A Kelvin connection circuit may require two electrical conductors to be used for each terminal of the component to be measured resulting in a total of four electrical conductors being used to measure the resistance of the component. However, the techniques of this disclosure may, in some examples, not require two electrical conductors to be used for each terminal of the component. Instead, in some examples, two electrical conductors may be used for one of the terminals of the component and a single electrical conductor may be used for the other terminal of the component. In this way, the techniques of this disclosure may, in some examples, be able to reduce the number of electrical conductors needed to measure the resistance of a component relative to Kelvin connection measurement circuits. Moreover, reducing the number of electrical conductors may also reduce the number of contact pads needed to connect the electrical conductors between the measurement circuit and the component, thereby reducing the circuit area required to implement a resistance measurement system.

Air bag safety systems often use multiple different air bags, each of which may have an associated air bag squib for which the resistance may be measured. For such air bag safety systems, a multiple channel resistance measurement system may be used to measure the resistance of the air bag squibs where each channel is configured to measure the resistance of a particular air bag squib. In such systems, the number of electrical connections (e.g., bond wires) needed to measure the squib resistances may be multiplied by the number of channels. For example, an air bag safety system that has an eight channel squib driver circuit that measures the resistance of eight different air bag squibs may, in some cases, require at least 8 channels*2(bond wires/channel)=16 bond wires. If Kelvin connections are used, 32 bond wires may be needed (i.e., 4 bond wires/channel). Such a solution may be costly in terms of the amount of output pins needed for the multi-channel driver circuit and/or the amount of area needed on a PCB to implement the connections. The techniques of this disclosure may, in some examples, be used to reduce the number of electrical connections needed to measure the air bag squib resistance relative to number of electrical connections required when using Kelvin connections while still providing the ability to compensate for electrical connection resistance.

Another solution to deal with the electrical conductor resistance contribution is to subtract a predetermined value for the electrical conductor resistance in a microcontroller calculation. Because the electrical conductor resistance value is predetermined, however, such a solution may not necessarily compensate for temperature variations (i.e., bond resistance variations that are caused by temperature variations), and therefore, may deliver a relatively moderate amount of accuracy. However, because the techniques of this disclosure may, in some examples, measure the resistance of an electrical conductor at the same time as or at a time that is proximate to when the resistance of the component is being measured, the techniques of this disclosure may, in such examples, compensate for temperature variations.

FIG. 1 is a block diagram illustrating an example system 10 that may be used to perform the resistance measurement techniques of this disclosure. System 10 may be any type of system that includes a component having a resistance and that measures the resistance of the component. In some examples, system 10 may be an air bag safety system that includes one or more air bag squibs. In such examples, each of the air bag squibs may have a resistance, and system 10 may measure the resistance of one or more of the air bag squibs. System 10 includes a component 12, measurement circuitry 14, and conductors 16, 18.

Component 12 may be any component that has a resistance. In some examples, component 12 may perform a function within system 10. For example, if system 10 is an air bag safety system, component 12 may, in some examples, be an air bag squib that heats up in response to a current flowing through the squib and ignites an explosion that is used for inflating an air bag in the air bag safety system.

Component 12 is electrically coupled to measurement circuitry 14 via conductors 16, 18. Component 12 includes terminals 20, 22. Terminal 20 is electrically coupled to conductor 16, and terminal 22 is electrically coupled to conductor 18.

The resistance of component 12 may refer to a resistance defined between terminal 20 and terminal 22 of component 12. In some examples, terminals 20, 22 may be coupled to opposite ends of a resistor included in component 12 and/or to opposite ends of resistive material included in component 12. For example, terminal 20 may be coupled to a first end of a resistor and/or to a first end of resistive material in component 12, and terminal 22 may be coupled to a second end of the resistor and/or to a second end of the resistive material in component 12. The second end of the resistor and/or resistive material may be opposite the first end of the resistor and/or resistive material.

Measurement circuitry 14 is configured to measure the resistance of component 12. Measurement circuitry 14 may include, for example, analog circuitry, digital circuitry, analog-to-digital converters (ADCs), a microcontroller or any combination thereof. The circuitry included in measurement circuitry 14 may be configured to measure the resistance of component 12 according to any of the techniques in this disclosure.

Measurement circuitry 14 is electrically coupled to component 12 via conductors 16, 18. Measurement circuitry 14 includes terminals 24, 26. Terminal 24 is electrically coupled to conductor 16, and terminal 26 is electrically coupled to conductor 18.

Conductors 16, 18 may each be any type of electrical conductor. In some examples, all of or a portion of one or both of conductors 16, 18 may be bond wires. In such examples, the bond wires may be formed using a wire bonding technique that is used to manufacture printed circuit boards (PCBs). Conductors 16, 18 are each electrically coupled between component 12 and measurement circuitry 14.

Conductor 16 includes ends 28, 30, and conductor 18 includes ends 32, 34. End 28 of conductor 16 is electrically coupled to terminal 24 of measurement circuitry 14, and end 30 of conductor 16 is electrically coupled to terminal 20 of component 12. Similarly, end 32 of conductor 18 is electrically coupled to terminal 26 of measurement circuitry 14, and end 34 of conductor 18 is electrically coupled to terminal 22 of component 12.

Conductors 16, 18 may each have a resistance. The resistance of conductor 16 may refer to a resistance defined between end 28 and end 30 of conductor 16. Similarly, the resistance of conductor 18 may refer to a resistance defined between end 32 and end 34 of conductor 18.

According to this disclosure, measurement circuitry 14 may be configured to measure a resistance of an electrical conductor, and generate a value indicative of a resistance of component 12 based on the measured resistance of the electrical conductor. In some examples, the electrical conductor used to determine the resistance of component 12 may be one of conductors 16, 18. In further examples, the electrical conductor used to determine the resistance of component 12 may be an electrical conductor other than one of conductors 16, 18. In some cases, the electrical conductor may be a bond wire.

To generate the value indicative of the resistance of component 12 based on the measured resistance of the electrical conductor, measurement circuitry 14 may, in some examples, measure the resistance of a current path that includes component 12 and one or more electrical conductors, and generate the value indicative of the resistance between terminal 20 and terminal 22 of component 12 based on the measured resistance of the current path and the measured resistance of the electrical conductor.

In some examples, the current path that includes component 12 may be a current path formed by conductor 16, component 12, and conductor 18. For example, end 28 of conductor 16 may form a first end of the current path, end 30 of conductor 16 may be electrically coupled to terminal 20 of component 12, terminal 22 of component 12 may be electrically coupled to end 34 of conductor 18, and end 32 of conductor 18 may form a second end of the current path.

In such examples, the electrical conductor for which the resistance is measured may, in some examples, be one of conductors 16 and 18 included in the current path. In further examples, the electrical conductor for which the resistance is measured may be a conductor that is not included in the current path that is formed by conductor 16, component 12, and conductor 18.

To measure the resistance of the current path, measurement circuitry 14 may, in some examples, apply an electrical stimulus to the current path, and measure one or more electrical signals that are generated at the ends of the current path in response to the electrical stimulus. In such examples, measurement circuitry 14 may determine the resistance of the current path based on the magnitude of the applied electrical stimulus and the magnitude of the measured electrical signals.

In some examples, the electrical stimulus applied to the current path may be a current and the measured electrical signals may correspond to a voltage measured between the ends of the current path. For example, measurement circuitry 14 may drive a current through the current path, and measure a voltage difference between the ends of the current path (e.g., a voltage difference between end 28 and end 32). The voltage difference may be generated by the current path in response to the current. In such examples, measurement circuitry 14 may determine the resistance of the current path based on the magnitude of the applied current and the magnitude of the measured voltage. For example, measurement circuitry 14 may determine the quotient of the magnitude of the measured voltage divided by the magnitude of the applied current, and the quotient may correspond to the resistance of the current path.

In further examples, the electrical stimulus applied to the current path may be a voltage applied across the ends of the current path, and the measured electrical signals may correspond to the current flowing through the current path. For example, measurement circuitry 14 may apply a voltage across the ends of the current path (e.g., end 28 and end 32), and measure a current that flows through the current path in response to the applied voltage. To measure the current that flows through the current path, measurement circuitry 14 may measure the current that enters and/or exits one of the ends of the current path. In such examples, measurement circuitry 14 may determine the resistance of the current path based on the magnitude of the applied voltage and the magnitude of the measured current. For example, measurement circuitry 14 may determine the quotient of the magnitude of the applied voltage divided by the magnitude of the measured current, and the quotient may correspond to the resistance of the current path.

To generate the value indicative of the resistance between terminal 20 and terminal 22 of component 12 based on the measured resistance of the current path and the measured resistance of the electrical conductor, measurement circuitry 14 may, in some examples, subtract a multiple of the measured resistance of the electrical conductor from the measured resistance of the current path. In some examples, the multiple of the measured resistance of the electrical conductor may be twice the measured resistance of the electrical conductor. In such examples, the two multiples of the measured resistance of the electrical conductor may correct for both of conductors 16, 18 in the current path.

In further examples, to generate the value indicative of the resistance between terminal 20 and terminal 22 of component 12 based on the measured resistance of the current path and the measured resistance of the electrical conductor, measurement circuitry 14 may, in some examples, determine one or more correction values based on the measured resistance of the electrical conductor, and generate the value indicative of the resistance between terminal 20 and terminal 22 of component 12 based on the measured resistance of the current path and the one or more correction values. In some examples, the one or more correction values may include a correction value that corresponds to a multiple of the measured resistance of the electrical conductor.

In further examples, measurement circuitry 14 may generate the one or more correction values based on relative lengths of one or more of the electrical conductors. For example, measurement circuitry 14 may determine one or more correction values based on the measured resistance of a first electrical conductor and based on at least one of a length of conductor 16 relative to the length of the first electrical conductor and a length of conductor 18 relative to the length of the first electrical conductor. In such examples, measurement circuitry 14 may generate the value indicative of the resistance between terminal 20 and terminal 22 of component 12 based on the measured resistance of the current path and the one or more correction values.

In additional examples, measurement circuitry 14 may time-multiplex the electrical conductor resistance measurements and the component resistance measurement. For example, measurement circuitry 14 may switch between an electrical conductor measurement phase where electrical conductor resistance measurements are performed and a component resistance measurement phase where component resistance measurements are performed. Time-multiplexing the resistance measurements may, in some examples, allow the electrical conductor resistance measurements and the component resistance measurements to share all or part of a common signal path. For example, the electrical conductor resistance measurements and the component resistance measurements may share a common analog-to-digital converter that is time-multiplexed.

In further examples, measurement circuitry 14 may perform all or part of the electrical conductor measurement while performing all or part of the component resistance measurement. In additional examples, measurement circuitry 14 may periodically measure the electrical conductor resistance between and/or during the component resistance measurements.

In some examples, component 12 and measurement circuitry 14 may be disposed on a substrate, for example, one or more printed circuit boards (PCBs). In such examples, measurement circuitry 14 may, in some examples, be implemented on one or more integrated circuits, and component 12 may, in some examples, be implemented as a component that is separate from the integrated circuits upon which measurement circuitry 14 is implemented. In such examples, terminals 24, 26 may each be implemented, in some examples, as a respective pad (e.g., a contact pad) on the PCB that is electrically coupled to the one or more integrated circuits that form measurement circuitry 14, and terminals 20, 22 may each be implemented as a respective pad (e.g., a contact pad) on the PCB that is electrically coupled to component 12. In such examples, conductors 16, 18 may each be implemented, in some examples, as a wire bond and/or as wire bonding that is electrically coupled between respective pads on the PCB.

In some examples, system 10 may be an air bag safety system and component 12 may be an air bag squib. In such examples, measurement circuitry 14 may be configured to generate a value indicative of the resistance of the air bag squib based on the measured resistance of the electrical conductor. In such examples, measurement circuitry 14 may, in some examples, be configured to detect a fault condition for the air bag squib based on the value indicative of the resistance of the air bag squib.

Figure 2:
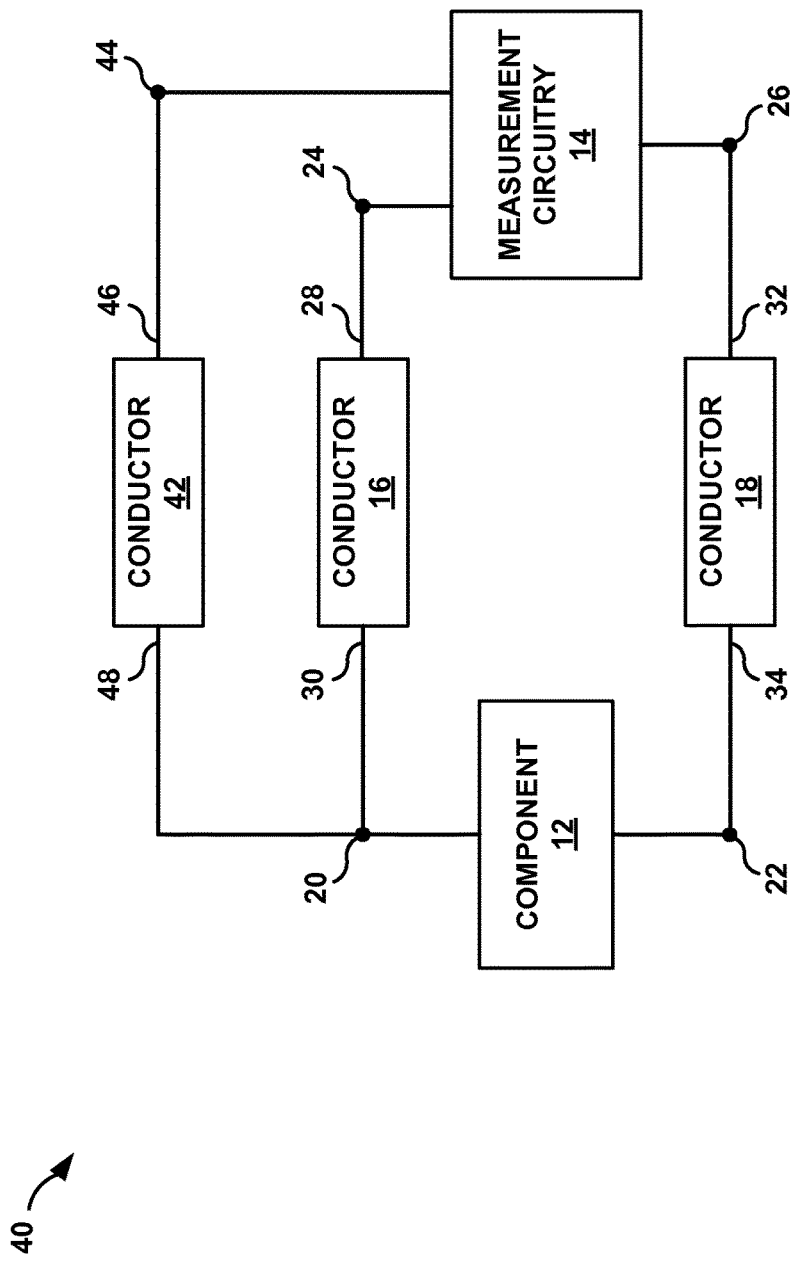
FIGS. 2 and 3 are block diagrams illustrating example systems that may be used to implement the system of FIG. 1 according to this disclosure.

FIG. 2 is a block diagram illustrating an example system 40 that may be used to implement system 10 of FIG. 1 according to this disclosure. System 40 of FIG. 2 includes the same components as system 10 of FIG. 1 except that system 40 of FIG. 2 further includes conductor 42 and that measurement circuitry 14 further includes a terminal 44. In the example system 40 of FIG. 2, measurement circuitry 14 is configured to measure the resistance of conductor 16 in order to determine the resistance of component 12.

Similar to conductors 16, 18, conductor 42 may any type of electrical conductor. In some examples, conductor 42 may be a bond wire. In such examples, the bond wire may be formed using a wire bonding technique that is used to manufacture printed circuit boards (PCBs). Conductor 42 is electrically coupled between component 12 and measurement circuitry 14.

Conductor 42 includes ends 46, 48. End 46 of conductor 42 is electrically coupled to terminal 44 of measurement circuitry 14 and end 48 of conductor 42 is electrically coupled to terminal 20 of component 12.

As shown in FIG. 2, end 48 of conductor 42 is electrically coupled to terminal 20 of component 12. Electrically coupling conductor 42 to component 12 in this manner may facilitate the measurement of the resistance of conductor 16 as described in further detail later in this disclosure.

As also shown in FIG. 2, conductor 42 and conductor 16 are electrically coupled to the same terminal (i.e., terminal 20) of component 12. In cases where the terminals of component 12 and measurement circuitry 14 represent pads on a PCB, electrically coupling conductor 42 and conductor 16 to the same terminal of component 12 may allow the resistance of conductor 16 to be measured, in some examples, without requiring more than one additional pad.

In some examples, terminal 44 of measurement circuitry 14 may be configured to cause substantially no current to flow through conductor 42. For example, terminal 44 may have a high input impedance. Input impedance may refer to the impedance that is seen looking into measurement circuitry 14. Causing substantially no current to flow through conductor 42 may facilitate the measurement of the resistance of conductor 16 as described in further detail later in this disclosure.

During operation, measurement circuitry 14 may measure the resistance of conductor 16, measure the resistance of a current path formed by conductor 16, component 12, and conductor 18, and generate a value indicative of the resistance of component 12 based on the measured resistance of conductor 16 and the measured resistance of the current path. In some examples, measurement circuitry 14 may measure the resistance of the current path and generate the value indicative of the resistance of component 12 in substantially the same manner as that which was described above with respect to measurement circuitry 14 shown in FIG. 1.

To measure the resistance of conductor 16, measurement circuitry 14 may, in some examples, drive a current through the current path formed by conductor 16, component 12, and conductor 18. While driving the current through the current path, measurement circuitry 14 may measure a voltage difference between terminal 24 and terminal 44 that is generated in response to driving the current through the current path. Measuring the voltage difference between terminal 24 and terminal 44 may correspond to measuring the voltage difference between end 28 of conductor 16 and end 46 of conductor 42. Because terminal 44 may be configured to cause substantially no current to flow through conductor 42, the voltage difference between terminal 24 and terminal 44 may be indicative of a voltage across conductor 16 (i.e., a voltage difference between end 28 and end 30 of conductor 16).

In such examples, measurement circuitry 14 may determine the resistance of conductor 16 based on the measured voltage difference between terminal 24 and terminal 44. For example, measurement circuitry 14 may determine the quotient of the magnitude of the measured voltage difference divided by the magnitude of the applied current. The quotient may correspond to the resistance of conductor 16.

In examples where measurement circuitry 14 determines one or more correction values based on the relative lengths of one or more of the electrical conductors, measurement circuitry 14 may, in some examples, determine a first correction value that corresponds to the resistance of conductor 16, and determine a second correction value based on the length of conductor 16 relative to the length of conductor 18. For example, measurement circuitry 14 may determine the second correction value by multiplying the measured resistance of conductor 16 by a ratio of the length of conductor 18 divided by the length of conductor 16. In such examples, measurement circuitry 14 may determine the resistance of component 12 based on the correction values. For example, measurement circuitry 14 may subtract each of the correction values from the measured resistance of the current path to determine the resistance of component 12.

Figure 3:
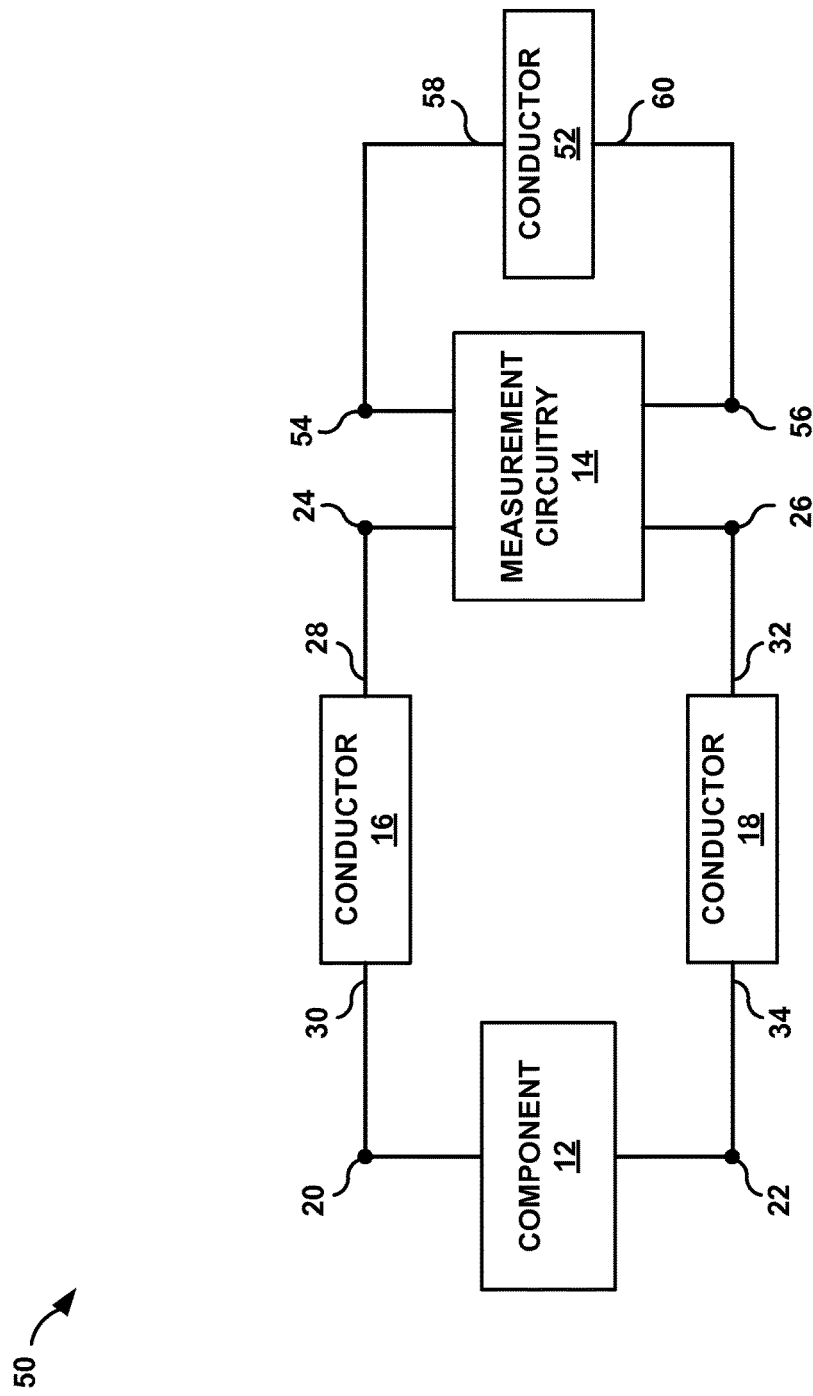

FIG. 3 is a block diagram illustrating an example system 50 that may be used to implement the system 10 of FIG. 1 according to this disclosure. System 50 of FIG. 3 includes the same components as system 10 of FIG. 1 except that system 50 of FIG. 2 further includes conductor 52 and that measurement circuitry 14 further includes terminals 54 and 56. In the example system 50 of FIG. 3, measurement circuitry 14 is configured to measure the resistance of conductor 52 in order to determine the resistance of component 12.

Similar to conductors 16, 18, conductor 52 may any type of electrical conductor. In some examples, conductor 52 may be a bond wire. In such examples, the bond wire may be formed using a wire bonding technique that is used to manufacture printed circuit boards (PCBs). Conductor 52 is electrically coupled between two different terminals 54, 56 of measurement circuitry 14.

Conductor 52 includes ends 58, 60. End 58 of conductor 52 is electrically coupled to terminal 54 of measurement circuitry 14, and end 60 of conductor 52 is electrically coupled to terminal 56 of measurement circuitry 14.

During operation, measurement circuitry 14 may measure the resistance of conductor 52, measure the resistance of a current path formed by conductor 16, component 12, and conductor 18, and generate a value indicative of the resistance of component 12 based on the measured resistance of conductor 52 and the measured resistance of the current path. In some examples, measurement circuitry 14 may measure the resistance of the current path and generate the value indicative of the resistance of component 12 in substantially the same manner as that which was described above with respect to measurement circuitry 14 shown in FIG. 1.

To measure the resistance of conductor 52, measurement circuitry 14 may, in some examples, apply an electrical stimulus to conductor 52, and measure one or more electrical signals that are generated at the ends 58, 60 of conductor 52 in response to the electrical stimulus. In such examples, measurement circuitry 14 may determine the resistance of conductor 52 based on the magnitude of the applied electrical stimulus and the magnitude of the measured electrical signals.

In some examples, the electrical stimulus applied to conductor 52 may be a current and the measured electrical signals may correspond to a voltage measured between the ends 58, 60 of the conductor 52. For example, measurement circuitry 14 may drive a current through conductor 52, and measure a voltage difference between the ends 58, 60 of conductor 52 (e.g., a voltage difference between end 58 and end 60). The voltage difference may be generated by conductor 52 in response to the applied current. In such examples, measurement circuitry 14 may determine the resistance of conductor 52 based on the magnitude of the applied current and the magnitude of the measured voltage. For example, measurement circuitry 14 may determine the quotient of the magnitude of the measured voltage divided by the magnitude of the applied current, and the quotient may correspond to the resistance of conductor 52.

In further examples, the electrical stimulus applied to conductor 52 may be a voltage applied across the ends 58, 60 of conductor 52, and the measured electrical signals may correspond to the current flowing through conductor 52. For example, measurement circuitry 14 may apply a voltage across the ends 58, 60 of conductor 52 (e.g., end 58 and end 60), and measure a current that flows through conductor 52 in response to the applied voltage. To measure the current that flows through conductor 52, measurement circuitry 14 may measure the current that enters and/or exits one of ends 58, 60 of conductor 52. In such examples, measurement circuitry 14 may determine the resistance of conductor 52 based on the magnitude of the applied voltage and the magnitude of the measured current. For example, measurement circuitry 14 may determine the quotient of the magnitude of the applied voltage divided by the magnitude of the measured current, and the quotient may correspond to the resistance of conductor 52.

In examples where measurement circuitry 14 determines one or more correction values based on the relative lengths of one or more of the electrical conductors, measurement circuitry 14 may, in some examples, determine a first correction value that corresponds to the resistance of conductor 16 based on the length of conductor 16 relative to the length of conductor 52, and determine a second correction value based on the length of conductor 18 relative to the length of conductor 52. For example, measurement circuitry 14 may determine the first correction value by multiplying the measured resistance of conductor 52 by a ratio of the length of conductor 16 divided by the length of conductor 52, and determine the second correction value by multiplying the measured resistance of conductor 52 by a ratio of the length of conductor 18 divided by the length of conductor 52. In such examples, measurement circuitry 14 may determine the resistance of component 12 based on the correction values. For example, measurement circuitry 14 may subtract each of the correction values from the measured resistance of the current path to determine the resistance of component 12.

Figure 4:
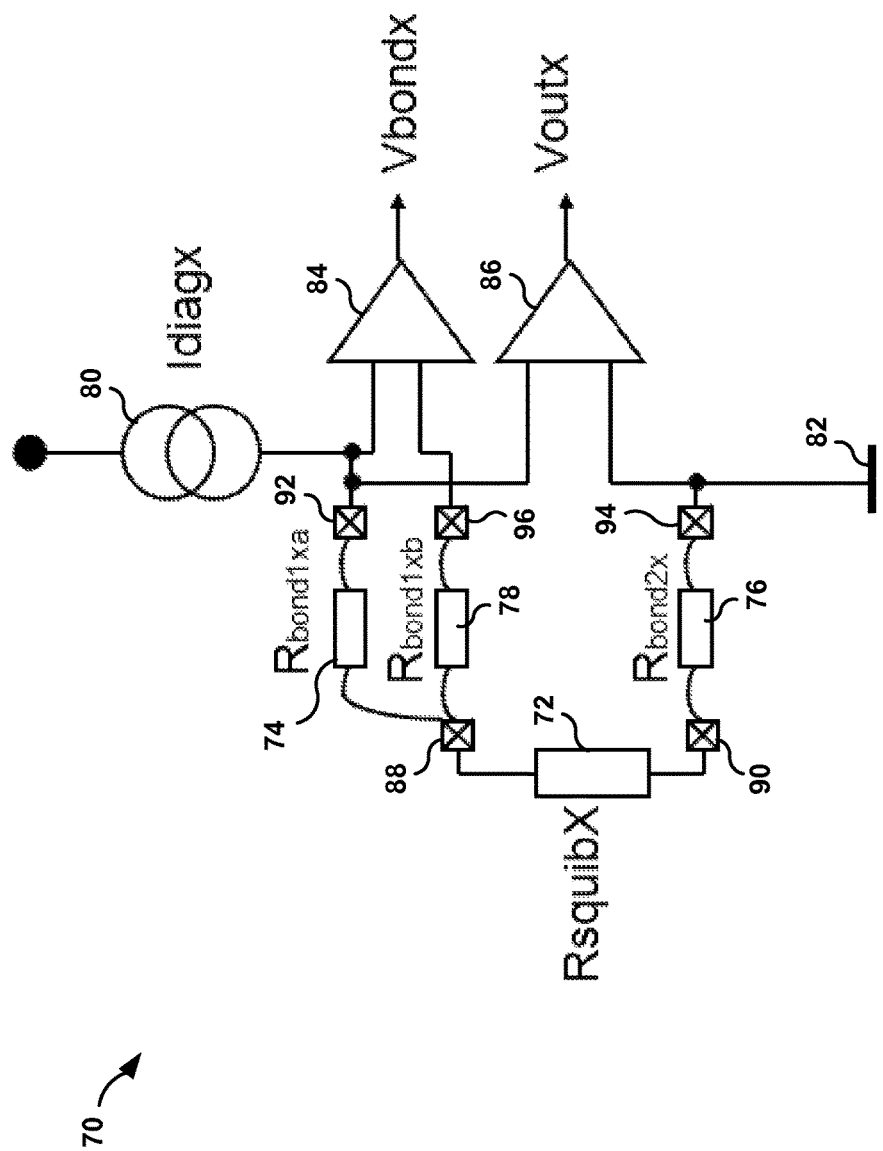
FIGS. 4 and 5 are schematic diagrams illustrating example air bag safety systems that may implement the systems of FIG. 1 and/or FIG. 2 according to this disclosure.

FIG. 4 is a schematic diagram illustrating an example air bag safety system 70 that may implement the example systems of FIG. 1 and/or FIG. 2 according to this disclosure. Air bag safety system 70 includes a squib resistor 72, bond wires 74, 76, 78, a current source 80, a ground voltage 82, amplifiers 84, 86, and pads 88, 90, 92, 94, 96.

In some examples, squib resistor 72 may correspond to component 12 shown in FIGS. 1 and 2, bond wires 74 and 76 may correspond to conductors 16 and 18, respectively, shown in FIGS. 1 and 2, bond wire 78 may correspond to conductor 42 shown in FIG. 2, pads 88, 90, 92 and 94 may correspond to terminals 20, 22, 24 and 26, respectively, shown in FIGS. 1 and 2, pad 96 may correspond to terminal 44 shown in FIG. 2. In further examples, current source 80, and amplifiers 84 and 86 may form all or part of measurement circuitry 14 shown in FIGS. 1 and 2.

A first end of squib resistor 72 is electrically coupled to pad 88 and a second end of squib resistor 72 is electrically coupled to pad 90. A first end of bond wire 74 is electrically coupled to pad 92 and a second end of bond wire 74 is electrically coupled to pad 88. A first end of bond wire 76 is electrically coupled to pad 94 and a second end of bond wire 74 is electrically coupled to pad 90. A first end of bond wire 78 is electrically coupled to pad 96 and a second end of bond wire 78 is electrically coupled to pad 88.

Current source 80 is electrically coupled to pad 92, a first terminal of amplifier 84, and a first terminal of amplifier 86. Ground voltage 82 is electrically coupled to pad 94 and a second terminal of amplifier 86. A first terminal of amplifier 84 is electrically coupled to current source 80, pad 92, and a first terminal of amplifier 86. A second terminal of amplifier 84 is electrically coupled to pad 96. A first terminal of amplifier 86 is electrically coupled to current source 80, pad 92, and a first terminal of amplifier 84. A second terminal of amplifier 86 is electrically coupled to pad 94 and ground voltage 82.

During operation, current source 80 is configured to drive a current (i.e., Idiagx) through a current path formed by bond wire 74, squib resistor 72, and bond wire 76. While the current (i.e., Idiagx) is being driven through the current path, amplifier 84 may measure a voltage difference (i.e., Vbondx) between pad 92 and pad 96. For example, amplifier 84 may amplify a difference between the voltages at pad 92 and pad 96. The voltage difference (i.e., Vbondx) between pad 92 and pad 96 may correspond to the voltage across bond wire 74. Subsequent processing stages of measurement circuitry 14 (not shown in FIG. 4) may determine a resistance of bond wire 74 based on the voltage difference (i.e., Vbondx) between pad 92 and pad 96. For example, the subsequent processing stages may determine the resistance of bond wire 74 such that the resistance equals Vbondx/Idiagx.

While the current (i.e., Idiagx) is being driven through the current path, amplifier 86 may measure a voltage difference (i.e., Voutx) between pad 92 and pad 94. For example, amplifier 86 may amplify a difference between the voltages at pad 92 and pad 94. The voltage difference (i.e., Voutx) between pad 92 and pad 94 may correspond to the voltage across the ends of the current path formed by bond wire 74, squib resistor 72 and bond wire 76. Subsequent processing stages of measurement circuitry 14 (not shown in FIG. 4) may determine a resistance of the current path based on the voltage difference (i.e., Voutx) between pad 92 and pad 94. For example, the subsequent processing stages may determine the resistance of the current path such that the resistance equals Voutx/Idiagx.

The subsequent processing stages of measurement circuitry 14 (not shown in FIG. 4) may generate a value indicative of the resistance of squib resistor 72 based on the resistance of the current path and the resistance of bond wire 74. In some example, the subsequent processing stages may subtract twice the resistance of bond wire 74 from the resistance of the current path. For example, the subsequent processing stages may, in such examples, generate the value indicative of the resistance of squib resistor 72 such that the value equals (Voutx/Idiagx)−2×(Vbondx/Idiagx). In further examples, the subsequent processing stages of measurement circuitry 14 may generate one or more correction values based on the lengths of and/or based on the relative lengths of one or more of bond wires 74, 76, 78, and generate the value indicative of the resistance of squib resistor 72 based on the one or more correction values.

Figure 5:
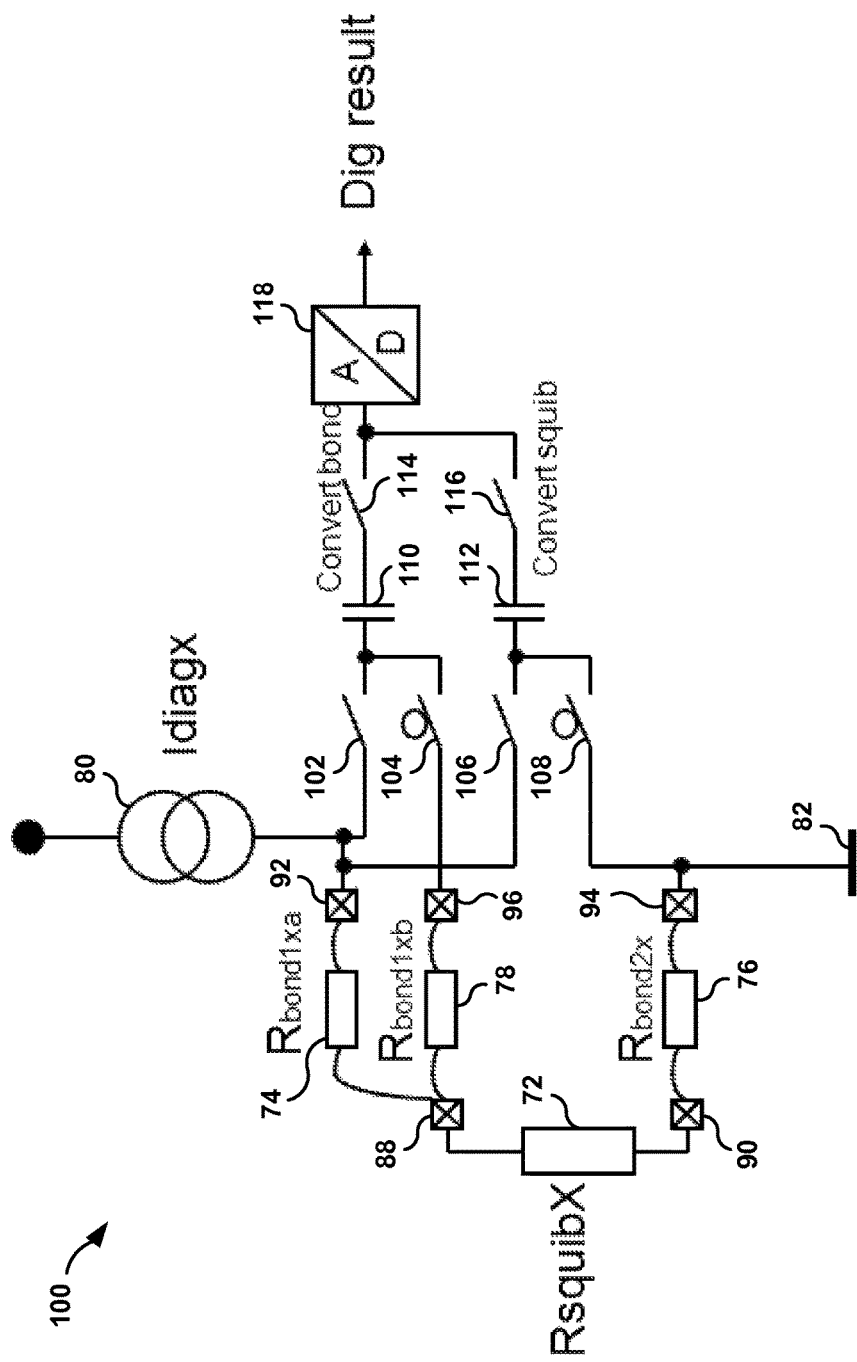

FIG. 5 is a schematic diagram illustrating an example air bag safety system 100 that may implement the example systems of FIG. 1 and FIG. 2 according to this disclosure. Air bag safety system 100 includes a squib resistor 72, bond wires 74, 76, 78, a current source 80, a ground voltage 82, pads 88, 90, 92, 94, 96, switches 102, 104, 106, 108, capacitors 110, 112, switches 114, 116 and an analog-to-digital converter (ADC) 118. Air bag safety system 100 includes many of the same components as those shown in FIG. 4 except that amplifiers 84, 86 in FIG. 4 have been replaced by switches 102, 104, 106, 108, capacitors 110, 112, switches 114, 116, and ADC 118. Components that have the same numbers between FIGS. 4 and 5 have already been described above with respect to FIG. 4. Accordingly, in the interest of brevity and to avoid redundancy, such components will not be described in further detail.

Current source 80 is electrically coupled to pad 92, a first terminal of switch 102, and a first terminal of switch 106. Ground voltage 82 is electrically coupled to pad 94 and a first terminal of switch 108. A first terminal of switch 102 is electrically coupled to current source 80, pad 92, and a first terminal of switch 106. A first terminal of switch 104 is electrically coupled to pad 96. A first terminal of switch 106 is electrically coupled to current source 80, pad 92, and a first terminal of switch 102. A first terminal of switch 108 is electrically coupled to pad 94 and ground voltage 82.

A second terminal of switch 102 is electrically coupled to a first terminal of capacitor 110 and a second terminal of switch 104. The second terminal of switch 104 is electrically coupled to a first terminal of capacitor 110 and a second terminal of switch 102. A second terminal of switch 106 is electrically coupled to a first terminal of capacitor 112 and a second terminal of switch 108. The second terminal of switch 108 is electrically coupled to a first terminal of capacitor 112 and a second terminal of switch 106.

A first terminal of capacitor 110 is electrically coupled to second terminals of switches 102, 104, and a second terminal of capacitor 110 is electrically coupled to a first terminal of switch 114. A first terminal of capacitor 112 is electrically coupled to second terminals of switches 106, 108, and a second terminal of capacitor 112 is electrically coupled to a first terminal of switch 116.

A first terminal of switch 114 is electrically coupled to a second terminal of capacitor 110, and a second terminal of switch 114 is electrically coupled to ADC 118. A first terminal of switch 116 is electrically coupled to a second terminal of capacitor 112, and a second terminal of switch 116 is electrically coupled to ADC 118. ADC 118 is electrically coupled to second terminals of switches 114, 116.

Switches 102, 104, 106, 108, 114, 116 are each configured to switch between operating in an open state and a closed state based on respective control signals. The control signals may be generated by a control unit (not shown). When operating in the closed state, each of switches 102, 104, 106, 108, 114, 116 may cause a first terminal of the respective switch to be electrically coupled to a second terminal of the respective switch. When operating in the open state, each of switches 102, 104, 106, 108, 114, 116 may cause a first terminal of the respective switch to not be electrically coupled to a second terminal of the respective switch.

Switches 102, 104, 106, 108 may cycle between an open state and a close state at a frequency that is based on the sampling frequency for air bag safety system 100. As shown in FIG. 5, switches 104 and 108 include bubbles while switches 102 and 106 do not include bubbles. The bubble on switch 104 indicates that switch 104 may be closed when switch 102 is open, and that switch 104 may be open when switch 102 is closed. Similarly, the bubble on switch 108 indicates that switch 108 may be closed when switch 106 is open, and that switch 108 may be open when switch 106 is closed.

Switches 102, 104 and capacitor 110 are configured to sample a voltage difference between pad 92 and pad 96 at a sampling frequency. Switches 106, 108 and capacitor 112 are configured to sample a voltage difference between pad 92 and pad 94 at a sampling frequency. ADC 118 is configured to convert the sampled signal to a digital signal. In some examples, ADC 118 may be a successive approximation register (SAR) ADC.

Air bag safety system 100 may operate in a time-multiplexed fashion where resistance measurements for bond wire 74 are performed at a separate time than resistance measurements for squib resistor 72. During a bond wire resistance measurement phase, switch 114 may be closed and switch 116 may be open. During a squib resistance measurement phase, switch 116 may be closed and switch 114 may be open.

During operation, air bag safety system 100 cycles between bond wire resistance measurement phases and squib resistor measurement phases in a time-multiplexed fashion. During a bond wire resistance measurement phase, switch 114 may be closed, switch 116 may be open, and switches 102, 104 may cycle between open and closed states based on a sampling frequency. Also during the bond wire resistance measurement phase, current source 80 may drive a current (i.e., Idiagx) through a current path formed by bond wire 74, squib resistor 72, and bond wire 76. While the current is being driven through the current path, switches 102, 104 and capacitor 110 may sample a voltage difference between pad 92 and pad 96. The voltage difference between pad 92 and pad 96 may correspond to the voltage across bond wire 74. ADC 118 may convert the sampled voltage difference into a digital signal that is indicative of the voltage difference across bond wire 74. Subsequent processing stages of measurement circuitry 14 (not shown in FIG. 5) may determine a resistance of bond wire 74 based on the voltage difference between pad 92 and pad 96.

During a squib resistor measurement phase, switch 116 may be closed, switch 114 may be open, and switches 106, 108 may cycle between open and closed states based on a sampling frequency. Also during the squib resistor measurement phase, current source 80 may drive a current (i.e., Idiagx) through a current path formed by bond wire 74, squib resistor 72, and bond wire 76. While the current is being driven through the current path, switches 106, 108 and capacitor 112 may sample a voltage difference between pad 92 and pad 94. The voltage difference between pad 92 and pad 94 may correspond to the voltage across the ends of the current path formed by bond wire 74, squib resistor 72 and bond wire 76. ADC 118 may convert the sampled voltage difference into a digital signal that is indicative of the voltage difference across the current path. Subsequent processing stages of measurement circuitry 14 (not shown in FIG. 5) may determine a resistance of the current path based on the voltage difference between pad 92 and pad 94.

The subsequent processing stages of measurement circuitry 14 (not shown in FIG. 5) may generate a value indicative of the resistance of squib resistor 72 based on the resistance of the current path and the resistance of bond wire 74. The techniques for generating the value indicative of the resistance of squib resistor 72 may be substantially the same as or similar to the techniques described above with respect to FIGS. 1, 2 and 4.

Figure 6:
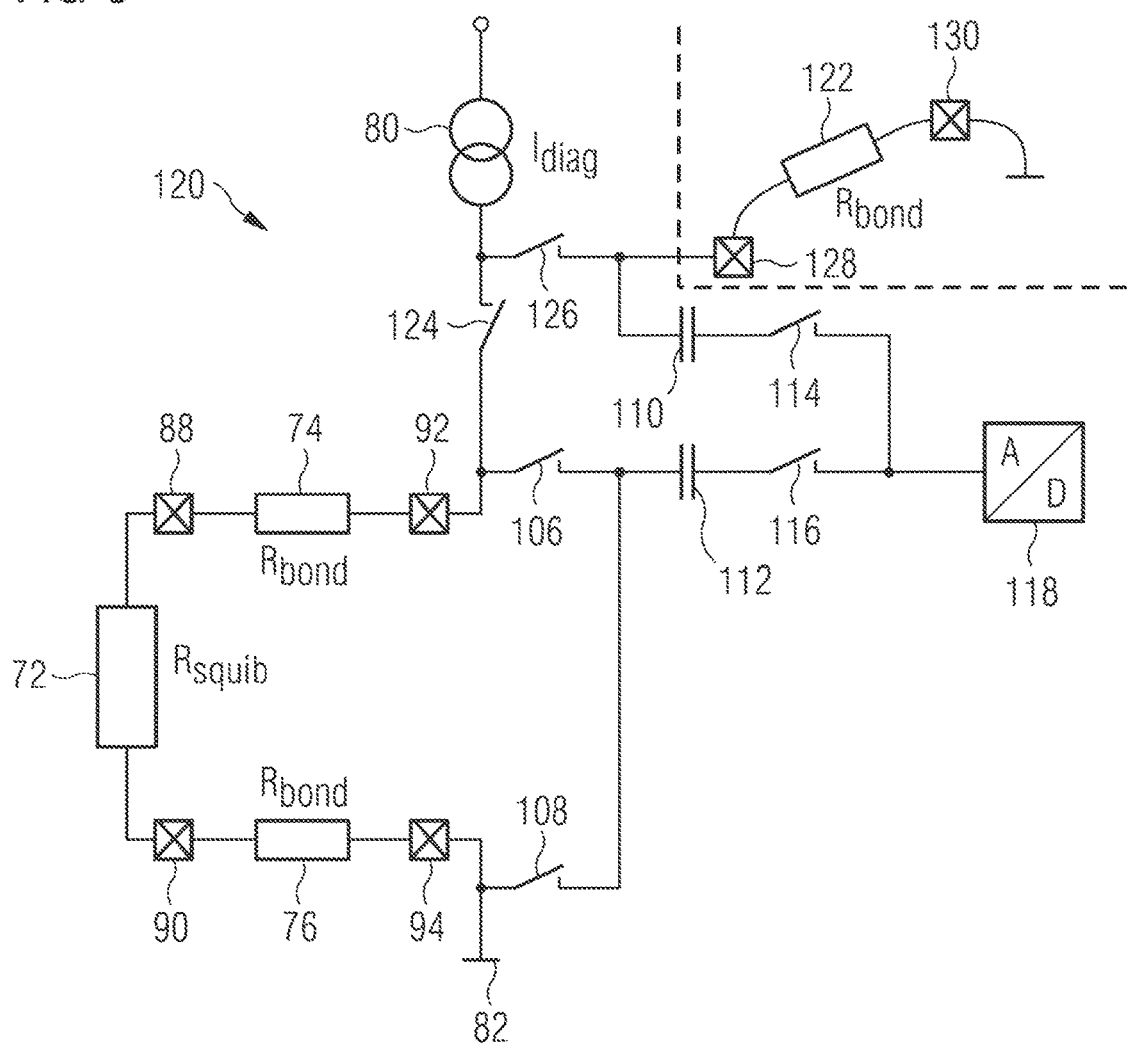
FIG. 6 is a schematic diagram illustrating an example air bag safety system that may implement the systems of FIG. 1 and/or FIG. 3 according to this disclosure.

FIG. 6 is a schematic diagram illustrating an example air bag safety system 120 that may implement the example systems of FIG. 1 and/or FIG. 3 according to this disclosure. Air bag safety system 120 includes a squib resistor 72, bond wires 74, 76, 122, a current source 80, a ground voltage 82, pads 88, 90, 92, 94, switches 124, 126, switches 106, 108, capacitors 110, 112, switches 114, 116, and ADC 118.

Air bag safety system 120 includes many of the same components as those shown in FIG. 5 except that bond wire 78 and pad 96 in FIG. 4 have been replaced by bond wire 122 and pads 128 and 130. In addition, switches 102, 104 have been removed and switches 124, 126 have been added. Components that have the same numbers between FIGS. 5 and 6 have already been described above with respect to FIG. 5. Accordingly, in the interest of brevity and to avoid redundancy, such components will not be described in further detail.

In some examples, squib resistor 72 may correspond to component 12 shown in FIGS. 1 and 3, bond wires 74 and 76 may correspond to conductors 16 and 18, respectively, shown in FIGS. 1 and 3, bond wire 122 may correspond to conductor 52 shown in FIG. 3, pads 88, 90, 92 and 94 may correspond to terminals 20, 22, 24 and 26, respectively, shown in FIGS. 1 and 3, pads 128 and 130 may correspond to terminals 54 and 56, respectively, shown in FIG. 3. In further examples, current source 80, ground voltage 82, switches 124, 126, switches 106, 108, capacitors 110, 112, switches 114, 116, and ADC 118 may form all or part of measurement circuitry 14 shown in FIGS. 1 and 3.

A first end of squib resistor 72 is electrically coupled to pad 88, and a second end of squib resistor 72 is electrically coupled to pad 90. A first end of bond wire 74 is electrically coupled to pad 92, and a second end of bond wire 74 is electrically coupled to pad 88. A first end of bond wire 76 is electrically coupled to pad 94, and a second end of bond wire 74 is electrically coupled to pad 90. A first end of bond wire 122 is electrically coupled to pad 128, and a second end of bond wire 122 is electrically coupled to pad 130.

Current source 80 is electrically coupled to a first terminal of switch 124 and a first terminal of switch 126. A second terminal of switch 124 is electrically coupled to pad 92 and a first terminal of switch 106. A second terminal of switch 126 is electrically coupled to pad 128 and a first terminal of capacitor 110. Ground voltage 82 is electrically coupled to pad 94 and a first terminal of switch 108.

A first terminal of switch 106 is electrically coupled to a second terminal of switch 124 and pad 92. A first terminal of switch 108 is electrically coupled to pad 94 and ground voltage 82. A second terminal of switch 106 is electrically coupled to a first terminal of capacitor 112 and a second terminal of switch 108. The second terminal of switch 108 is electrically coupled to a first terminal of capacitor 112 and a second terminal of switch 106.

A first terminal of capacitor 110 is electrically coupled to a second terminal of switch 126 and pad 128. A second terminal of capacitor 110 is electrically coupled to a first terminal of switch 114. A first terminal of capacitor 112 is electrically coupled to second terminals of switches 106, 108, and a second terminal of capacitor 112 is electrically coupled to a first terminal of switch 116.

A first terminal of switch 114 is electrically coupled to a second terminal of capacitor 110, and a second terminal of switch 114 is electrically coupled to ADC 118. A first terminal of switch 116 is electrically coupled to a second terminal of capacitor 112, and a second terminal of switch 116 is electrically coupled to ADC 118. ADC 118 is electrically coupled to second terminals of switches 114, 116.

Similar to switches 106, 108, 114, 116, switches 124, 126 are each configured to switch between operating in an open state and a closed state based on respective control signals. Capacitor 110 is configured to sample a voltage at pad 128. Switches 106, 108 and capacitor 112 are configured to sample a voltage difference between pad 92 and pad 94 at a sampling frequency. ADC 118 is configured to convert the sampled signal to a digital signal. In some examples, ADC 118 may be a successive approximation register (SAR) ADC.

Air bag safety system 120 may operate in a time-multiplexed fashion where resistance measurements for bond wire 122 are performed at a separate time than resistance measurements for squib resistor 72. During a bond wire resistance measurement phase, switch 126 may be closed, switch 114 may be closed, switch 124 may be open, and switch 116 may be open. During a squib resistance measurement phase, switch 124 may be closed, switch 116 may be closed, switch 126 may be open, and switch 114 may be open.

During operation, air bag safety system 120 cycles between bond wire resistance measurement phases and squib resistor measurement phases in a time-multiplexed fashion. During a bond wire resistance measurement phase, switch 126 may be closed, switch 114 may be closed, switch 124 may be open, and switch 116 may be open. Also during the bond wire resistance measurement phase, current source 80 may drive a current (i.e., Idiagx) through bond wire 122. While the current is being driven through bond wire 122, capacitor 110 may sample a voltage at pad 128. The voltage at pad 128 may be indicative of the voltage across bond wire 122. ADC 118 may convert the sampled voltage difference into a digital signal that is indicative of the voltage difference across bond wire 122. Subsequent processing stages of measurement circuitry 14 (not shown in FIG. 6) may determine a resistance of bond wire 122 based on the sampled voltage.

During a squib resistor measurement phase, switch 124 may be closed, switch 116 may be closed, switch 126 may be open, switch 114 may be open, and switches 106, 108 may cycle between open and closed states based on a sampling frequency. Also during the squib resistor measurement phase, current source 80 may drive a current (i.e., Idiagx) through a current path formed by bond wire 74, squib resistor 72, and bond wire 76. While the current is being driven through the current path, switches 106, 108 and capacitor 112 may sample a voltage difference between pad 92 and pad 94. The voltage difference between pad 92 and pad 94 may correspond to the voltage across the ends of the current path formed by bond wire 74, squib resistor 72, and bond wire 76. ADC 118 may convert the sampled voltage difference into a digital signal that is indicative of the voltage difference across the current path. Subsequent processing stages of measurement circuitry 14 (not shown in FIG. 6) may determine a resistance of the current path based on the voltage difference between pad 92 and pad 94.

The subsequent processing stages of measurement circuitry 14 (not shown in FIG. 6) may generate a value indicative of the resistance of squib resistor 72 based on the resistance of the current path and the resistance of bond wire 122. In some example, the subsequent processing stages may subtract twice the resistance of bond wire 122 from the resistance of the current path. In further examples, the subsequent processing stages of measurement circuitry 14 may generate one or more correction values based on the lengths of and/or based on the relative lengths of one or more of bond wires 74, 76, 122, and generate the value indicative of the resistance of squib resistor 72 based on the one or more correction values.

Figure 7:
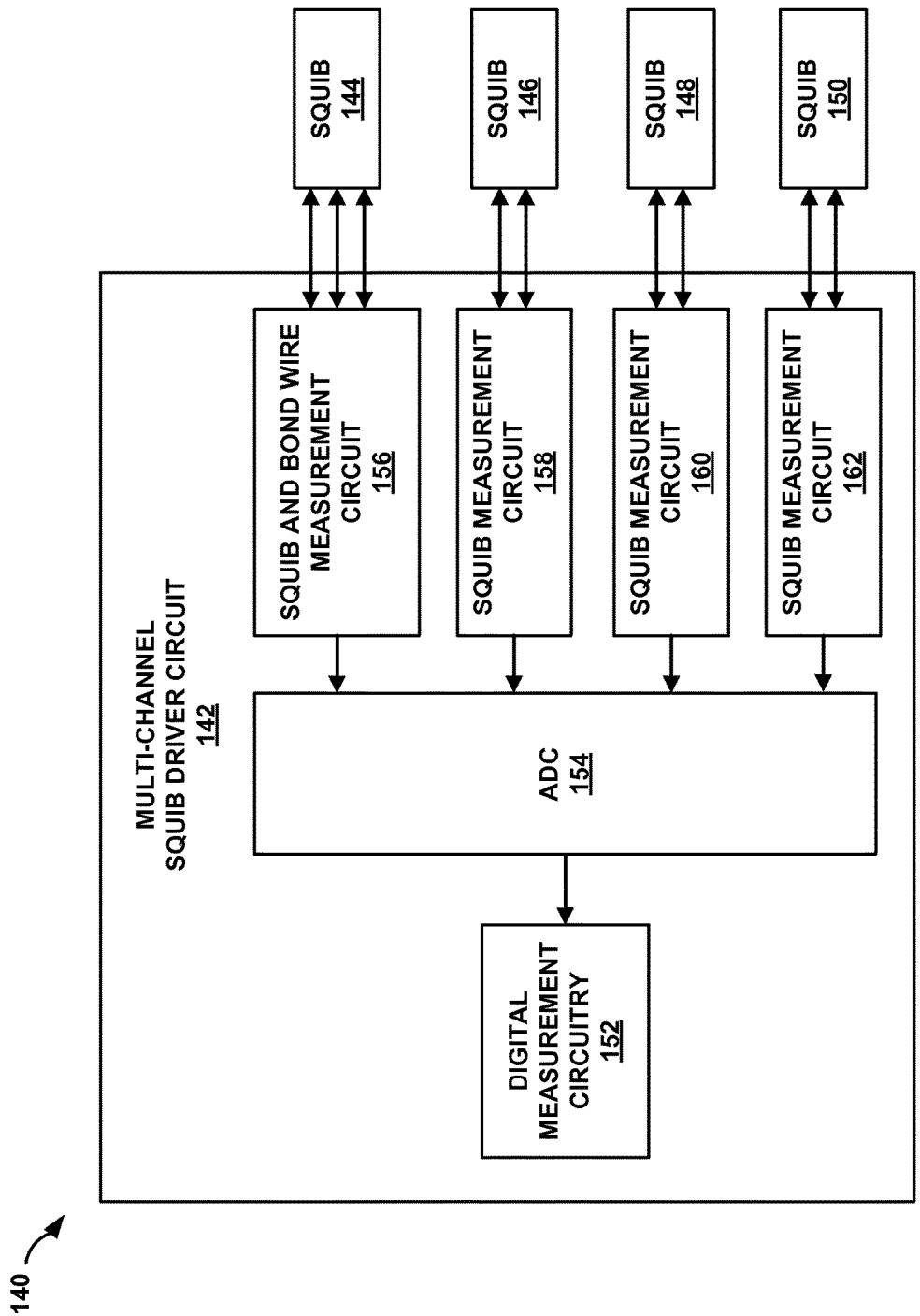
FIG. 7 is a block diagram illustrating an example air bag safety system that performs resistance measurements for a plurality of air bag squib channels according to this disclosure.

FIG. 7 is a block diagram illustrating an example air bag safety system 140 that performs resistance measurements for a plurality of air bag squib channels according to this disclosure. Air bag safety system 140 includes a multi-channel squib driver circuit 142 and squibs 144, 146, 148, 150.

Multi-channel squib driver circuit 142 is configured to monitor the operational status of squibs 144, 146, 148, 150. For example, multi-channel squib driver circuit 142 may monitor squibs 144, 146, 148, 150 to determine if there are any fault conditions associated with squibs 144, 146, 148, 150. Each of squibs 144, 146, 148, 150 may include a resistance that heats up in response to a current flowing through the squib and ignites an explosion that is used for inflating an air bag in air bag safety system 140.

Multi-channel squib driver circuit 142 includes digital measurement circuitry 152, an ADC 154, a squib and bond wire measurement circuit 156 and squib measurement circuits 158, 160, 162. Digital measurement circuitry 152 is electrically coupled to ADC 154. ADC 154 is electrically coupled to squib and bond wire measurement circuit 156, and squib measurement circuits 158, 160, 162. Squib and bond wire measurement circuit 156 is electrically coupled to squib 144 via three or more bond wires. Squib measurement circuits 158, 160, 162 are each electrically coupled to a respective one of squibs 146, 148, 150 via two bond wires.

Squib and bond wire measurement circuit 156 may be configured to measure the resistance of one or more bond wires and to measure the resistance of a current path that includes squib 144. The current path that includes squib 144 may include one or more bond wires in addition to squib 144. In some examples, squib and bond wire measurement circuit 156 may correspond to one of the measurement circuits shown in air bag safety system 70 of FIG. 4, air bag safety system 100 of FIG. 5, and air bag safety system 120 of FIG. 6.

Squib measurement circuits 158, 160, 162 are each configured to measure the resistance of a respective one of a plurality of current paths where each of the current paths includes a respective one of squibs 146, 148, 150. Each of the current paths may include one or more bond wires in addition to a respective one of squibs 146, 148, 150. In some examples, squib measurement circuits 158, 160, 162 may not be configured to measure a resistance of a bond wire. In further examples, one or more of squib measurement circuits 158, 160, 162 may correspond to the squib measurement circuit described below with respect to FIG. 8.

During operation, squib and bond wire measurement circuit 156 may measure the resistance of a bond wire and measure the resistance of a current path that includes squib 144. Squib measurement circuits 158, 160, 162 may each measure the resistance of a respective one of a plurality current paths where each of the current paths includes a respective one of squibs 146, 148, 150. ADC 154 may convert the resistance measurements performed by squib and bond wire measurement circuit 156 and squib measurement circuits 158, 160, 162 to digital signals, and provide the digital signals to digital measurement circuitry 152.

Digital measurement circuitry 152 may generate values indicative of the resistance of each of squibs 144, 146, 148, 150 based on the measurements provided by squib and bond wire measurement circuit 156 and squib measurement circuits 158, 160, 162. For example, digital measurement circuitry 152 may generate a value indicative of the resistance of squib 144 based on the resistance of the current path that includes squib 144 measured by squib and bond wire measurement circuit 156 and based on the resistance of the bond wire measured by squib and bond wire measurement circuit 156. As another example, digital measurement circuitry 152 may generate a value indicative of the resistance of squib 146 based on the resistance of the current path that includes squib 146 measured by squib measurement circuit 158 and based on the resistance of the bond wire measured by squib and bond wire measurement circuit 156. As a further example, digital measurement circuitry 152 may generate a value indicative of the resistance of squib 148 based on the resistance of the current path that includes squib 148 measured by squib measurement circuit 160 and based on the resistance of the bond wire measured by squib and bond wire measurement circuit 156.

As shown in FIG. 7, digital measurement circuitry 152 may, in some examples, use a squib and bond wire measurement circuit 156 in only one channel of multi-channel squib driver circuit 142 and use squib measurement circuits 158, 160, 162 in the remaining channels. In other words, a single bond wire resistance measurement generated by a single measurement circuit (i.e., squib and bond wire measurement circuit 156) may be used to generate resistance values for all of squibs 144, 146, 148, 150. Using a squib and bond wire measurement circuit 156 in one channel and squib measurement circuits 158, 160, 162 in the remaining channels as shown in FIG. 7 may reduce the number of bond wires and/or the number of pads needed to measure the squib resistance and to correct for the bond wire resistances compared to a circuit that uses a squib and bond wire measurement circuit 156 for each of the measurement channels.

Moreover, in some examples, squib measurement circuits 158, 160, 162 may take up less circuit area than squib and bond wire measurement circuit 156. Therefore, using a squib and bond wire measurement circuit 156 in one channel and squib measurement circuits 158, 160, 162 in the remaining channels as shown in FIG. 7 may reduce circuit area for multi-channel squib driver circuit 142.

Figure 8:
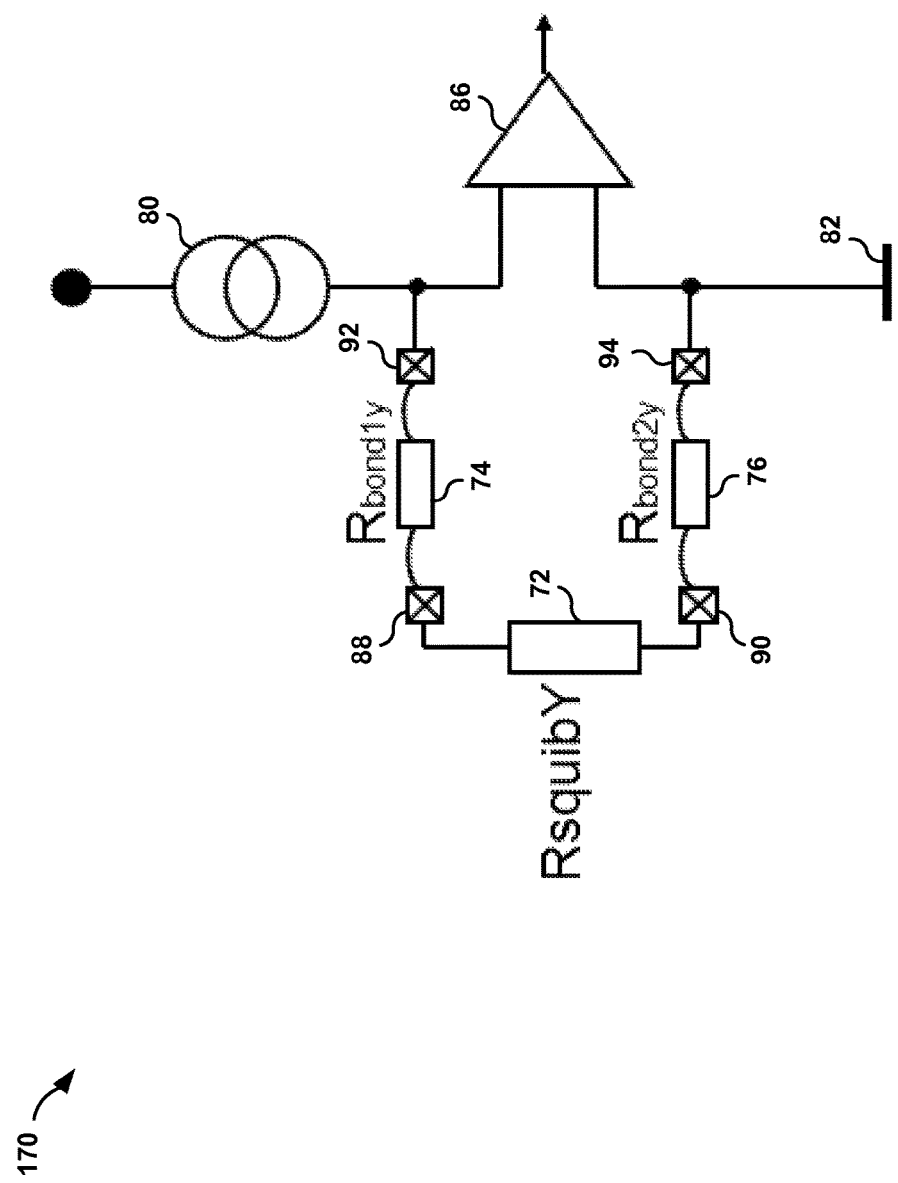
FIG. 8 is a block diagram illustrating an example squib measurement circuit that may be used in the air bag safety system of FIG. 7.

FIG. 8 is a block diagram illustrating an example squib measurement circuit 170 that may be used in the air bag safety system 140 of FIG. 7. In some examples, squib measurement circuit 170 may be used to implement any of squib measurement circuits 158, 160, 162 shown in FIG. 7. Squib measurement circuit 170 includes a squib resistor 72, bond wires 74, 76, a current source 80, a ground voltage 82, an amplifier 86, and pads 88, 90, 92, 94.

Squib measurement circuit 170 includes many of the same components as those shown in FIG. 4 except that bond wire 78, pad 96, and amplifier 84 have been removed. Components that have the same numbers between FIGS. 4 and 8 have already been described above with respect to FIG. 4. Accordingly, in the interest of brevity and to avoid redundancy, such components will not be described in further detail.

During operation, squib measurement circuit 170 may measure the resistance of a current path formed by bond wire 74, squib resistor 72, and bond wire 76. Notably, unlike the measurement circuit shown in FIG. 4, squib measurement circuit 170 is not configured to measure the resistance of any bond wires. However, squib measurement circuit 170 may require fewer bond wires than the measurement circuit shown in FIG. 4, may require fewer pads than the measurement circuit shown in FIG. 4, and/or may have a smaller circuit area than the measurement circuit shown in FIG. 4. As discussed above with respect to FIG. 7, in some examples, a driver circuit may not require all of the measurement circuits to measure bond wire resistance. Therefore, squib measurement circuit 170 may be used in multi-channel driver circuits to reduce the bond wire count, to reduce the pad count, and/or to reduce circuit area when another channel already contains a measurement circuit configured to measure bond wire resistance.

Figure 9:
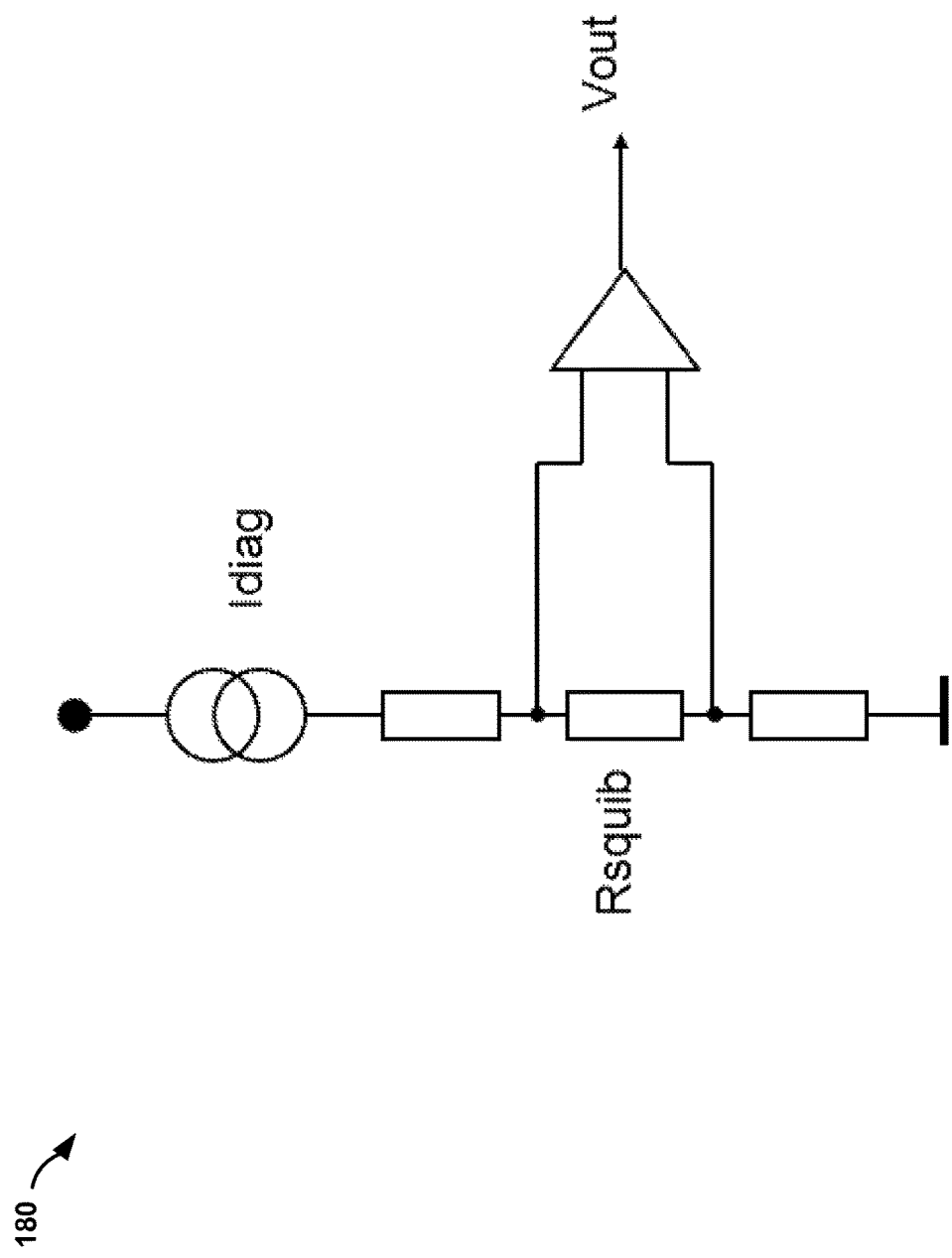
FIG. 9 is a schematic diagram illustrating a theoretical resistance measurement circuit.

FIG. 9 is a schematic diagram illustrating an example resistance measurement circuit 180. Resistance measurement circuit 180 conceptually depicts an ideal measurement without error sources. Airbag systems often perform squib diagnosis. One parameter used for squib diagnosis is the resistance measurement of the squib. There can several sources that may contribute to errors when measuring the resistance of a squib. The resistor may, in some examples, typically be in the range of 1 to 10 Ohms. To measure the resistance value, a diagnosis current may, in some examples, be injected into the squib and a voltage measurement at the squib nodes may be applied. The resistance may be calculated by Rsquib=Vout/Idiag. A major error can be added by the serial resistance in the measurement chain. This resistance can be added on the PCB, as a bond wire in the chip, or as metal resistance on the die.

Figure 10:
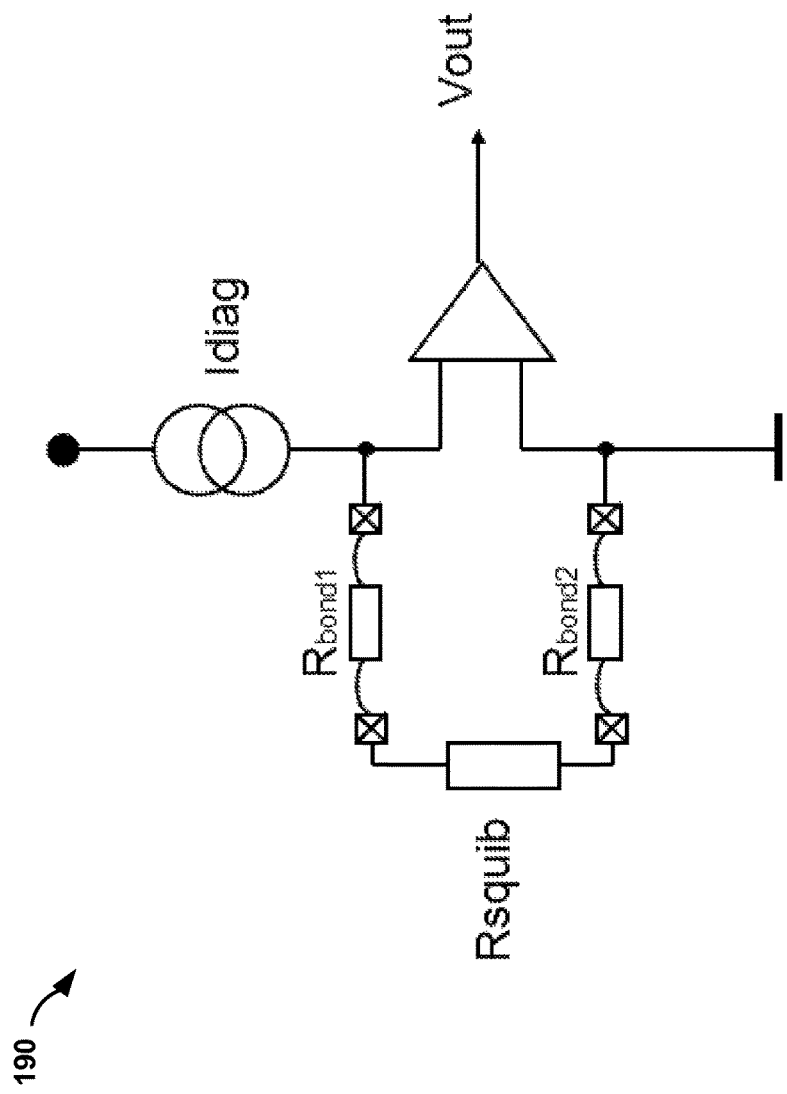
FIG. 10 is a schematic diagram illustrating sources of error in a resistance measurement circuit.

FIG. 10 is a schematic diagram illustrating sources of error in a resistance measurement circuit 190. More specifically, FIG. 10 shows a measurement with the presence of bond wires (i.e., Rbond1 and Rbond2). A bond wire of the chip may, in some examples, strongly influence the measurement result for the resistance of Rsquib. If a current (Idiag) is applied to the current path formed by Rbond1, Rsquib, and Rbond2 and a measured resistance is calculated based on Vout and Idiag (i.e., Vout/Idiag), then the measured resistance may be equal to Rsquib+Rbond1+Rbond2. In other words, Rbond1 and Rbond 2 may be sources of error for the resistance measurement of Rsquib.

Figure 11:
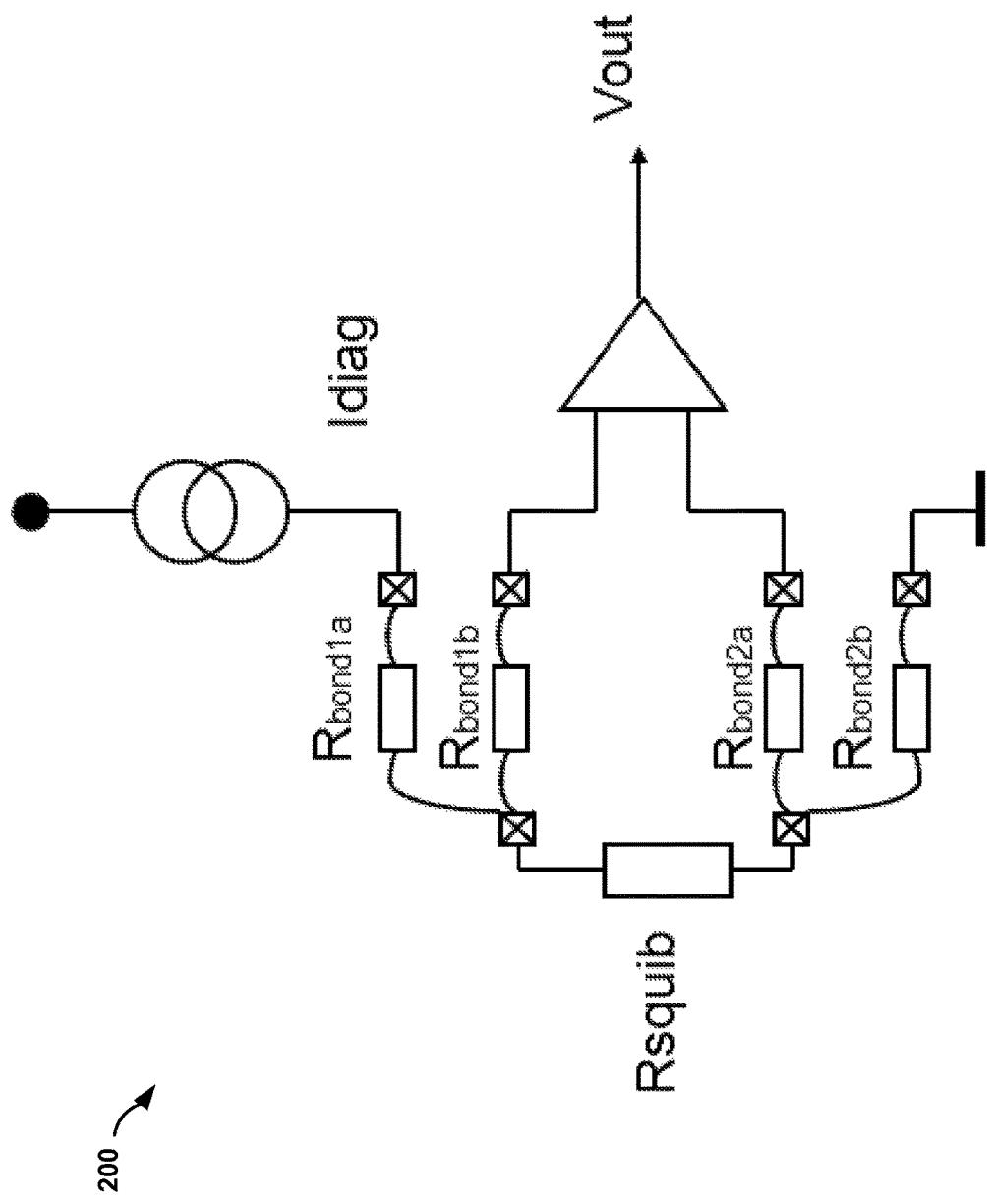
FIG. 11 is a schematic diagram illustrating an example resistance measurement circuit that includes a Kelvin connection.

One solution to get rid of the bond wire contribution is to use Kelvin connections to the squib nodes. FIG. 11 is a schematic diagram illustrating an example resistance measurement circuit 200 that includes Kelvin connections. A Kelvin connection circuit may require two bond wires per squib node connection for a total of four bond wires per squib. However, the techniques of this disclosure may, in some examples, not require two bond wires for every squib node connection. Instead, in some examples, two bond wires may be used for one of the squib node connections, and a single bond wire may be used for the other squib node connections. In this way, the number of bond wires may be reduced relative to Kelvin connection circuits.

Another solution to deal with the bond wire contribution is to subtract a predetermined value for the bond wire in a microcontroller calculation. Because the bond wire value is predetermined, however, such a solution may not necessarily compensate for temperature variations (i.e., bond resistance variations that are caused by temperature variations), and therefore, may deliver relatively moderate amount of accuracy. However, because the techniques of this disclosure may, in some examples, measure the resistance of the bond wire at the same time as or at a time that is proximate to when the resistance of the squib is being measured, the techniques of this disclosure, in such examples, may compensate for temperature variations.

Figure 12:
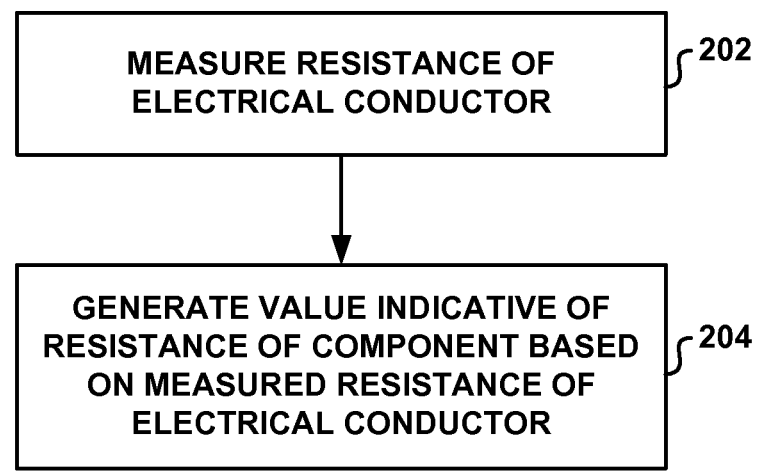
FIG. 12 is a flow diagram illustrating an example technique for performing resistance measurements according to this disclosure.

FIG. 12 is a flow diagram illustrating an example technique for performing resistance measurements according to this disclosure. The technique illustrated in FIG. 12 may be performed, in some examples, with any of the measurement systems shown in FIGS. 1-7. For ease of description, however, the technique will be described with respect to measurement circuitry 14 shown in FIGS. 1-3.

Measurement circuitry 14 measures the resistance of an electrical conductor (202). Measurement circuitry 14 generates a value indicative of the resistance of component 12 based on the resistance of the electrical conductor (204).

In some examples, to generate the value indicative of the resistance of component 12, measurement circuitry 14 may measure a resistance of a current path that includes component 12 and one or more electrical conductors 16, 18. For example, the current path may be formed by conductor 16, component 12, and conductor 18. In such examples, measurement circuitry 14 may generate the value indicative of the resistance of component 12 based on the measured resistance of the current path and the measured resistance of the electrical conductor. In some cases, the value indicative of the resistance of component 12 may be a value indicative of a resistance between terminals 20, 22 of component 12.

In some examples, the electrical conductor for which the resistance is measured may be the same as one of the electrical conductors included in the current path formed by conductor 16, component 12, and conductor 18. For example, the electrical conductor may correspond to conductor 16 shown in FIG. 2. In such examples, to determine the resistance of conductor 16, an additional conductor 42 may be electrically coupled between component 12 and measurement circuitry 14 such that end 48 of conductor 42 is electrically coupled to end 30 of conductor 16. In such examples, to determine the resistance of conductor 16, measurement circuitry 14 may, in some examples, measure a voltage difference between end 46 of conductor 42 and end 28 of conductor 16, and determine a resistance of conductor 16 based on the measured voltage difference.

In further examples, the electrical conductor for which the resistance is measured may be different than the electrical conductors in the current path that includes component 12 and one or more electrical conductors 16, 18. For example, the electrical conductor may correspond to conductor 52 shown in FIG. 3.

In additional examples, to generate the value indicative of the resistance of component 12, measurement circuitry 14 may subtract a multiple of the measured resistance of the electrical conductor from the measured resistance of the current path. For example, measurement circuitry 14 may subtract, in some examples, two times the measured resistance of the electrical conductor from the measured resistance of the current path.

In further examples, to generate the value indicative of the resistance of component 12, measurement circuitry 14 may determine one or more correction values based on the measured resistance of the electrical conductor and based on the relative lengths of one or more electrical conductors. For example, each of the correction values may be determined based on the measured resistance of a first electrical conductor (e.g., conductor 16 in FIG. 2 and/or conductor 52 in FIG. 3) and a length of a respective one of the one or more of the electrical conductors (e.g., conductors 16, 18) included in the current path relative to the first electrical conductor. In such examples, measurement circuitry 14 may generate a value indicative of the resistance between terminals 20, 22 of component 12 based on the measured resistance of the current path and the one or more correction values.

In some cases, measurement circuitry 14 may measure the resistance of a current path that includes component 12 and measure the resistance of the electrical conductor in a time-multiplexed fashion. For example, measurement circuitry 14 may switch between an electrical conductor resistance measurement phase and a component resistance measurement phase. During the electrical conductor resistance measurement phase, measurement circuitry 14 may measure the resistance of the electrical conductor. During the component resistance measurement phase, measurement circuitry 14 may generate the value indicative of the resistance of component 12.

In some examples, component 12 may be an air bag squib. In such examples, measurement circuitry 14 may generate a value indicative of the resistance of the air bag squib based on the measured resistance of the electrical conductor. Also in such examples, measurement circuitry 14 may, in some examples, detect a fault condition for the air bag squib based on the value indicative of the resistance of the air bag squib.

Typically, a squib diagnosis system is implemented in a squib driver with more than one driver per chip. Configurations with 4 or 8 drivers per chip are often used. FIG. 7 illustrates an example squib driver with 4 drivers per chip. The techniques of this disclosure, in some examples, may add an additional bond wire for one of the driver channels to measure the value of a bond wire. FIG. 4 illustrates an example where an additional bond wire (i.e., Rbond1xb) is added to a measurement circuit relative to the measurement circuit shown in FIG. 10. The Rbond1xb bond wire may be used to measure the resistance of the Rbond1xa bond wire.

In FIG. 4, the bond wire resistance is measured by the voltage Vbondx (i.e., the voltage Vbondx may be indicative of the bond wire resistance). The calculated value of the bond resistance may, in some examples, be subtracted from the measurement result in a microcontroller. If all bond wires are designed with the same length, there may, in some examples, be only one value that is subtracted. If the bond wires have different length, the proper value may be calculated by the knowledge of the length. The resistance may be linear proportional to the length of the wire.

In some examples, the techniques of this disclosure may provide temperature cancellation. A resistor may be temperature dependent. By applying the measurement sequentially, in some examples, the temperature behavior may be tracked by the measurement.

In some examples, the techniques of this disclosure may not require a Kelvin connection for all of the squib nodes. Instead, in some examples, a Kelvin connection may be used for a single node. This may reduce chip area (e.g., due to reducing the number of pads needed for Kelvin connections) and reduce bond wires.

In some examples, an ADC may be implemented to measure directly the voltages at the squib. The ADC may use a switched capacitor circuit for sampling. This architecture allows another switch to be added for measuring the bond wire voltage (Vbond). This measurement may also be applied quasi-differentially to measure the voltage between the bond wire connections (i.e., the voltage of the component). The ADC, in some examples, may be multiplexed between squib measurement and bond wire measurement.

FIG. 5 shown an example that uses a switched capacitor circuit followed by an ADC. The capacitors and switches shown in FIG. 5 may, in some examples, be a part of the ADC. In some examples, a ground related sense bond wire may be used instead of Rbond1xb (e.g., an additional Rbond2xb bond wire instead of Rbond1xb bond wire). In such examples, this may ease the circuitry. In some examples, the digital results produced by the ADC may be processed by an on chip logic or passed to a microcontroller, which may perform the calculation of the correct squib resistance.

In some examples, the techniques of this disclosure may place at least one additional bond wire for diagnosis. In additional examples, the techniques of this disclosure may measure the value of this bond wire and correct the result. In further examples, the techniques of this disclosure may multiplex the measurement unit between resistance measurement and bond wire measurement. In additional examples, the techniques of this disclosure may calculate different correction values based on different wire length. In further examples, the techniques of this disclosure may be applied to squib/airbag diagnosis systems.

Various techniques described in this disclosure may be implemented in hardware, software, firmware or any combination thereof. For example, various aspects of the techniques may be implemented within or in conjunction with one or more microprocessors, digital signal processors (DSPs), application specific integrated circuits (ASICs), field programmable logic arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry.

When implemented in hardware, the circuit components described in this disclosure may be implemented as one or more discrete components, as one or more integrated devices, or any combination thereof. The circuit components described herein may be fabricated using any of a wide variety of process technologies including Complementary Metal-Oxide-Semiconductor (CMOS) process technologies.

When implemented in software, the functionality ascribed to the systems and devices described in this disclosure may be embodied as instructions on a computer-readable medium such as random access memory (RAM), read-only memory (ROM), non-volatile random access memory (NVRAM), electrically erasable programmable read-only memory (EEPROM), FLASH memory, magnetic media, optical media, or the like. The instructions may be executed to cause a processor to perform or support one or more aspects of the functionality described in this disclosure.

Various aspects and examples have been described. However, modifications can be made to the structure or techniques of this disclosure without departing from the scope of the following claims. In some examples, the resistance measurement techniques of this disclosure have been described with respect to measuring the resistance of an air bag squib in an air bag safety system. The resistance measurement techniques of this disclosure may be applied, however, to a wide variety of applications including, for example, automotive, industrial, and consumer applications. In addition, the resistance measurement techniques of this disclosure may be applied in applications where a driving line is used for sensing (e.g., measurement or control loop functions).

The invention claimed is:

1. A method comprising:
measuring, with a first amplifier of circuitry, while a current is driven through a current path formed by at least a first electrical conductor, a component, and a second electrical conductor, a voltage across ends of the current path formed by at least the first electrical conductor, the component, and the second electrical conductor to determine a resistance of the current path;
measuring, with a second amplifier of the circuitry, while the current is driven through the current path, a voltage across the first electrical conductor and a third electrical conductor to determine a resistance of the first electrical conductor; and
generating, with the circuitry, a value indicative of a resistance of the component based on the voltage across the first electrical conductor and the third electrical conductor and the voltage across ends of the current path formed by at least the first electrical conductor, the component, and the second electrical conductor.

2. The method of claim 1, further comprising:
driving, with the circuitry, the current through the current path formed by at least the first electrical conductor, the component, and the second electrical conductor.

3. The method of claim 1,
wherein a first end of the first electrical conductor forms a first end of the current path, a second end of the first electrical conductor being electrically coupled to a first terminal of the component, a second terminal of the component being electrically coupled to a first end of the second electrical conductor, a second end of the second electrical conductor forming a second end of the current path,
wherein the value indicative of the resistance of the component is a value indicative of a resistance between the first and second terminals of the component, and
wherein generating the value indicative of the resistance of the component comprises generating the value indicative of the resistance between the first and second terminals of the component based on the resistance of the current path and the resistance of the first electrical conductor.

4. The method of claim 3, wherein measuring the voltage across the first electrical conductor and the third electrical conductor comprises:
measuring a voltage difference between the first end of the first electrical conductor and a first end of the third electrical conductor, a second end of the third electrical conductor being electrically coupled to the second end of the first electrical conductor; and
determining the resistance of the first electrical conductor based on the measured voltage difference.

5. The method of claim 4, further comprising amplifying, with the second amplifier, the measured voltage difference between the first end of the first electrical conductor and the first end of the third electrical conductor.

6. The method of claim 1, wherein generating the value indicative of the resistance of the component comprises:
subtracting a multiple of the resistance of the first electrical conductor from the resistance of the current path.

7. The method of claim 1, wherein generating the value indicative of the resistance of the component comprises:
determining a correction value for the second electrical conductor, the correction value being determined based on the resistance of the first electrical conductor and a difference of length between the second electrical conductor and the first electrical conductor; and
generating the value indicative of the resistance of the component based further on the correction value.

8. The method of claim 1, further comprising:
switching between an electrical conductor resistance measurement phase and a component resistance measurement phase;
during the electrical conductor measurement phase, measuring the voltage across the first electrical conductor and the third electrical conductor; and
during the component resistance measurement phase, generating the value indicative of the resistance of the component.

9. The method of claim 1,
wherein the component comprises an air bag squib, and
wherein generating, with the circuitry, the value indicative of the resistance of the component comprises generating a value indicative of the resistance of the air bag squib based on the voltage across the first electrical conductor and the third electrical conductor and the voltage across ends of the current path formed by at least the first electrical conductor, the component, and the second electrical conductor.

10. The method of claim 9, further comprising:
detecting a fault condition for the air bag squib based on the value indicative of the resistance of the air bag squib.

11. A device comprising:
circuitry comprising:
a first amplifier configured to measure, while a current is driven through a current path formed by at least a first electrical conductor, a component, and a second electrical conductor, a voltage across ends of the current path formed by at least the first electrical conductor, the component, and the second electrical conductor to determine a resistance of the current path; and a second amplifier configured to measure, while the current is driven through the current path, a voltage across the first electrical conductor and a third electrical conductor to determine a resistance of the first electrical conductor, wherein the circuitry is configured to:
generate a value indicative of a resistance of the component based on the voltage across the first electrical conductor and the third electrical conductor and the voltage across ends of the current path formed by at least the first electrical conductor, the component, and the second electrical conductor.

12. The device of claim 11, wherein the circuitry is further configured to drive the current through the current path formed by at least the first electrical conductor, the component, and the second electrical conductor.

13. The device of claim 11,
wherein a first end of the first electrical conductor forms a first end of the current path, a second end of the first electrical conductor being electrically coupled to a first terminal of the component, a second terminal of the component being electrically coupled to a first end of the second electrical conductor, a second end of the second electrical conductor forming a second end of the current path,
wherein the value indicative of the resistance of the component is a value indicative of a resistance between the first and second terminals of the component, and
wherein the circuitry is further configured to generate the value indicative of the resistance between the first and second terminals of the component based on the resistance of the current path and the resistance of the first electrical conductor.

14. The device of claim 13, wherein the circuitry is further configured to:
measure a voltage difference between the first end of the first electrical conductor and a first end of the third electrical conductor, a second end of the third electrical conductor being electrically coupled to the second end of the first electrical conductor; and
determine the resistance of the first electrical conductor based on the measured voltage difference.

15. The device of claim 11, wherein the circuitry is further configured to:
subtract a multiple of the resistance of the first electrical conductor from the resistance of the current path.

16. The device of claim 11, wherein the circuitry is further configured to:
determine a correction value for the second electrical conductor, the correction value being determined based on the resistance of the first electrical conductor and a difference of length between the second electrical conductor and the first electrical conductor; and
generate the value indicative of the resistance of the component based further on the correction value.

17. The device of claim 11, wherein the circuitry is further configured to:
switch between an electrical conductor resistance measurement phase and a component resistance measurement phase;
during the electrical conductor resistance measurement phase, measure the voltage across the first electrical conductor and the third electrical conductor; and
during the component resistance measurement phase, generate the value indicative of the resistance of the component.

18. The device of claim 11,
wherein the component comprises an air bag squib, and
wherein the circuitry is further configured to generate a value indicative of the resistance of the air bag squib based on the voltage across the first electrical conductor and the third electrical conductor and the voltage across ends of the current path formed by at least the first electrical conductor, the component, and the second electrical conductor.

19. The device of claim 18, wherein the circuitry is further configured to detect a fault condition for the air bag squib based on the value indicative of the resistance of the air bag squib.

20. An apparatus comprising:
means for measuring, while a current is driven through a current path formed by at least a first electrical conductor, a component, and a second electrical conductor, a voltage across ends of the current path formed by at least the first electrical conductor, the component, and the second electrical conductor to determine a resistance of the current path;
means for measuring, while the current is driven through the current path, a voltage across the first electrical conductor and a third electrical conductor to determine a resistance of the first electrical conductor; and
means for generating a value indicative of a resistance of the component based on the voltage across the first electrical conductor and the third electrical conductor and the voltage across ends of the current path formed by at least the first electrical conductor, the component, and the second electrical conductor.

* * * * *